United States Patent
Ahn et al.

(10) Patent No.: US 12,232,318 B2
(45) Date of Patent: *Feb. 18, 2025

(54) NONVOLATILE MEMORY DEVICE

(71) Applicant: SAMSUNG ELECTRONICS CO., LTD., Suwon-si (KR)

(72) Inventors: Jae Ho Ahn, Seoul (KR); Sung-Min Hwang, Hwaseong-si (KR); Joon-Sung Lim, Seongnam-si (KR); Bum Kyu Kang, Suwon-si (KR); Sang Don Lee, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 338 days.

This patent is subject to a terminal disclaimer.

(21) Appl. No.: 17/726,899

(22) Filed: Apr. 22, 2022

(65) Prior Publication Data
US 2022/0246643 A1    Aug. 4, 2022

Related U.S. Application Data

(63) Continuation of application No. 16/890,115, filed on Jun. 2, 2020, now Pat. No. 11,315,947.

(30) Foreign Application Priority Data

Oct. 15, 2019  (KR) .......................... 10-2019-0127725

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ................................ H10B 43/27; H10B 43/20
See application file for complete search history.

(56) References Cited

U.S. PATENT DOCUMENTS 9,165,941 B2   10/2015   Yang et al.
9,196,630 B2   11/2015   Lee et al.
(Continued)

FOREIGN PATENT DOCUMENTS

KR   10-2013-0040023 A   4/2013
KR   10-2014-0138121 A   12/2014
KR   10-2020-0137434 A   12/2020

OTHER PUBLICATIONS

Notice of Allowance issued Jan. 29, 2024 by the the Korean Intellectual Property Office for corresponding Korean Application KR 10-2019-0127725.

*Primary Examiner* — Christopher A Johnson
(74) *Attorney, Agent, or Firm* — Muir Patent Law, PLLC

(57) ABSTRACT

A nonvolatile memory device including a mold structure including a plurality of gate electrodes on a substrate, the plurality of gate electrodes including first, second, and third string selection lines sequentially stacked on the substrate; a channel structure that penetrates the mold structure and intersects each of the gate electrodes; a first cutting region that cuts each of the gate electrodes; a second cutting region that is spaced apart from the first cutting region in a first direction and cuts each of the gate electrodes; a first cutting line that cuts the first string selection line between the first cutting region and the second cutting region; a second cutting line that cuts the second string selection line between the first cutting region and the second cutting region; and a third cutting line that cuts the third string selection line between the first cutting region and the second cutting region.

20 Claims, 30 Drawing Sheets

(51) Int. Cl.
    *H10B 41/27*     (2023.01)
    *H10B 41/35*     (2023.01)
    *H10B 43/10*     (2023.01)
    *H10B 43/35*     (2023.01)

(56) References Cited

U.S. PATENT DOCUMENTS

| | | |
|---|---|---|
| 9,799,672 B2 | 10/2017 | Son et al. |
| 11,315,947 B2 * | 4/2022 | Ahn ..................... H10B 41/10 |
| 2014/0004676 A1 | 1/2014 | Eom et al. |
| 2015/0003169 A1 * | 1/2015 | Nam ................... G11C 11/5628 |
| | | 365/185.25 |
| 2015/0332771 A1 * | 11/2015 | Kwon ..................... G11C 16/10 |
| | | 365/185.11 |
| 2016/0322381 A1 * | 11/2016 | Liu ........................ H10B 41/27 |
| 2018/0006055 A1 | 1/2018 | Kim et al. |
| 2018/0358375 A1 | 12/2018 | Ku et al. |
| 2019/0027490 A1 | 1/2019 | Shin et al. |
| 2019/0035808 A1 | 1/2019 | Hwang et al. |
| 2019/0067316 A1 | 2/2019 | Oh et al. |
| 2019/0279720 A1 * | 9/2019 | Nam ...................... H10B 43/27 |
| 2019/0287984 A1 * | 9/2019 | Yang ................. G11C 16/0466 |
| 2020/0051904 A1 * | 2/2020 | Tang ................... H10N 70/8822 |
| 2020/0381449 A1 | 12/2020 | Moon et al. |

\* cited by examiner

NONVOLATILE MEMORY DEVICE

CROSS-REFERENCE TO RELATED APPLICATIONS

This is a continuation application based on pending application Ser. No. 16/890,115, filed Jun. 2, 2020, the entire contents of which is hereby incorporated by reference.

Korean Patent Application No. 10-2019-0127725, filed on Oct. 15, 2019, in the Korean Intellectual Property Office, and entitled: "Nonvolatile Memory Device and Method for Fabricating the Same," is incorporated by reference herein in its entirety.

BACKGROUND

1. Field

Embodiments relate to a nonvolatile memory device and a method for fabricating the same.

2. Description of the Related Art

A semiconductor memory device may be broadly classified into a volatile memory device and a nonvolatile memory device.

The degree of integration of the nonvolatile memory device is increasing to satisfy excellent performance and low cost required by consumers. In the case of a two-dimensional or planar memory device, the degree of integration is determined by an area occupied by the unit memory cells. Recently, a three-dimensional memory device in which unit memory cells are placed vertically has been developed.

SUMMARY

The embodiments may be realized by providing a nonvolatile memory device including a mold structure including a plurality of gate electrodes on a substrate, the plurality of gate electrodes including first, second, and third string selection lines sequentially stacked on the substrate; a channel structure that penetrates the mold structure and intersects each of the plurality of gate electrodes; a first cutting region that cuts each of the plurality of gate electrodes; a second cutting region that is spaced apart from the first cutting region in a first direction and cuts each of the plurality of gate electrodes; a first cutting line that cuts the first string selection line between the first cutting region and the second cutting region; a second cutting line that cuts the second string selection line between the first cutting region and the second cutting region; and a third cutting line that cuts the third string selection line between the first cutting region and the second cutting region, wherein the first cutting line is spaced apart from the first cutting region by a first distance and is spaced apart from the second cutting region by a second distance, the second cutting line is spaced apart from the first cutting region by a third distance and is spaced apart from the second cutting region by a fourth distance, the third cutting line is spaced apart from the first cutting region by a fifth distance and is spaced apart from the second cutting region by a sixth distance, a first difference between the first distance and the second distance is greater than a third difference between the fifth distance and the sixth distance, and a second difference between the third distance and the fourth distance is greater than the third difference.

The embodiments may be realized by providing a nonvolatile memory device including a mold structure including a plurality of gate electrodes on a substrate, the plurality of gate electrodes including first, second, and third string selection lines sequentially stacked on the substrate; a channel structure that penetrates the mold structure and intersects each of the plurality of gate electrodes; a first cutting region that cuts each of the plurality of gate electrodes; a second cutting region that is spaced apart from the first cutting region in a first direction and cuts each of the plurality of gate electrodes; a first cutting line that cuts the first string selection line between the first cutting region and the second cutting region; a second cutting line that cuts the second string selection line between the first cutting region and the second cutting region; and a third cutting line that cuts a third string selection line between the first cutting region and the second cutting region, wherein the first cutting line is spaced apart from the first cutting region by a first distance and is spaced apart from the second cutting region by a second distance greater than the first distance, the second cutting line is spaced apart from the first cutting region by a third distance and is spaced apart from the second cutting region by a fourth distance smaller than the third distance, the third cutting line is spaced apart from the first cutting region by a fifth distance greater than the first distance and greater than the fourth distance, and the third cutting line is spaced apart from the second cutting region by a sixth distance greater than the first distance and greater than the fourth distance.

The embodiments may be realized by providing a nonvolatile memory device including a mold structure that includes a plurality of gate electrodes on a substrate, the plurality of gate electrodes including first, second, and third string selection lines sequentially stacked on the substrate; a channel structure that penetrates the mold structure and intersects each of the plurality of gate electrodes; a first cutting line that extends in a direction parallel to an upper surface of the substrate and cuts the first string selection line; a second cutting line that extends in the direction parallel to the upper surface of the substrate and cuts the second string selection line; and a third cutting line that extends in the direction parallel to the upper surface of the substrate and cuts the third string selection line, wherein a first area of the first string selection line on one side of the first cutting line is smaller than a second area of the first string selection line on another side of the first cutting line from a planar viewpoint, a third area of the second string selection line on one side of the second cutting line is greater than a fourth area of the second string selection line on another side of the second cutting line from a planar viewpoint, and a fifth area of the third string selection line on one side of the third cutting line and a sixth area of the third string selection line on another side of the third cutting line are greater than the first area and greater than the fourth area from a planar viewpoint.

The embodiments may be realized by providing a nonvolatile memory device including a mold structure that includes a plurality of word lines stacked on a substrate and first, second, and third string selection lines sequentially stacked on the plurality of word lines; a plurality of channel structures that penetrates the mold structure and is connected to the substrate; a first cutting region that cuts the mold structure; a second cutting region that is spaced apart from the first cutting region in a first direction parallel to an upper surface of the substrate and that cuts the mold structure, the first and second cutting regions extending in a second direction intersecting the first direction; a first cutting line that extends in the second direction and cuts the first string selection line between the first cutting region and the second cutting region; a second cutting line that extends in the second direction and cuts the second string selection line between the first cutting region and the second cutting region; and a third cutting line that extends in the second direction and cuts the third string selection line between the first cutting line and the second cutting line, wherein the first cutting line is spaced apart from the first cutting region by a first distance and is spaced apart from the second cutting region by a second distance greater than the first distance, and the second cutting line is spaced apart from the first cutting region by a third distance and is spaced apart from the second cutting region by a fourth distance smaller than the third distance.

The embodiments may be realized by providing a method of fabricating a nonvolatile memory device, the method including forming a first sacrificial pattern and an insulating pattern alternately stacked on a substrate; forming a second sacrificial pattern on the first sacrificial pattern and the insulating pattern; forming a first cutting line that cuts the second sacrificial pattern; forming a third sacrificial pattern on the second sacrificial pattern and the first cutting line; forming a second cutting line that cuts the third sacrificial pattern; forming a fourth sacrificial pattern on the third sacrificial pattern and the second cutting line; forming a third cutting line that cuts the fourth sacrificial pattern; cutting the first, second, third, and fourth sacrificial patterns and the insulating pattern to form first and second cutting regions spaced apart from each other across the first, second, and third cutting lines; and replacing the first, second, third, and fourth sacrificial patterns with a plurality of conductive patterns, using the first and second cutting regions, wherein the first cutting line is spaced apart from the first cutting region by a first distance and is spaced apart from the second cutting region by a second distance, the second cutting line is spaced apart from the first cutting region by a third distance and is spaced apart from the second cutting region by a fourth distance, the third cutting line is spaced apart from the first cutting region by a fifth distance and is spaced apart from the second cutting region by a sixth distance, a first difference between the first distance and the second distance is greater than a third difference between the fifth distance and the sixth distance, and a second difference between the third distance and the fourth distance is greater than the third difference.

BRIEF DESCRIPTION OF THE DRAWINGS

Features will be apparent to those of skill in the art by describing in detail exemplary embodiments with reference to the attached drawings in which.

DETAILED DESCRIPTION

A nonvolatile memory device according to some embodiments will be described below with reference to FIGS. 1 through 17.

Figure 1:
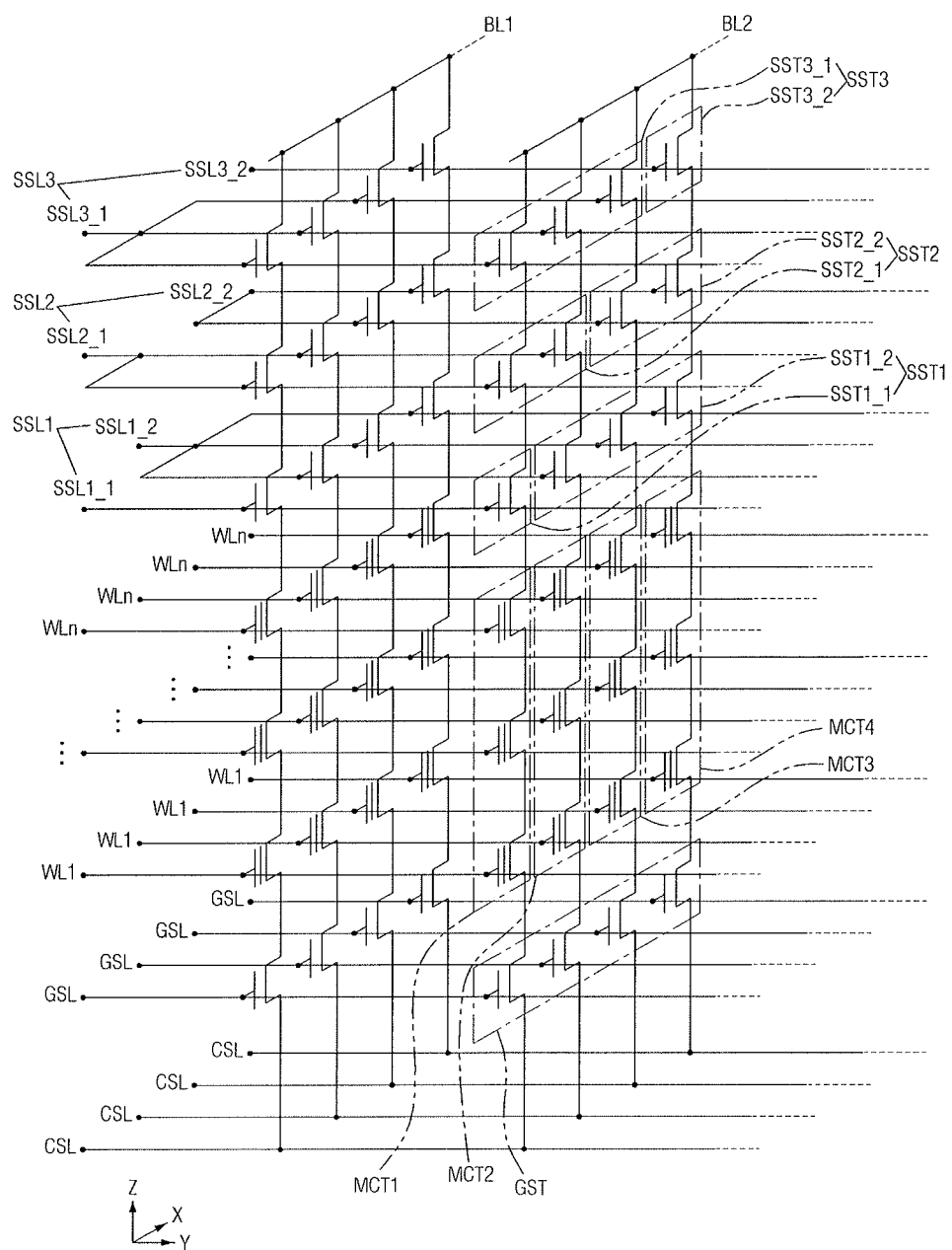
FIG. 1 illustrates an exemplary circuit diagram of the nonvolatile memory device according to some embodiments.

FIG. 1 is an exemplary circuit diagram of the nonvolatile memory device according to some embodiments.

Referring to FIG. 1, a memory cell array of the nonvolatile memory device according to some embodiments may include a common source line CSL, a plurality of bit lines BL1 and BL2, and a plurality of cell strings CSTR1 to CSTR4.

The plurality of bit lines BL1 and BL2 may be arranged two-dimensionally. In an implementation, the respective bit lines BL1 and BL2 may be spaced apart from each other and extend in a first direction X. A plurality of cell strings CSTR1 to CSTR4 may be connected in parallel to each of the bit lines BL1 and BL2. The cell strings CSTR1 to CSTR4 may be commonly connected to a common source line CSL. In an implementation, a plurality of cell strings CSTR1 to CSTR4 may be between the plurality of bit lines BL1 and BL2 and the common source line CSL.

A plurality of common source lines CSL may be arranged two-dimensionally. In an implementation, the respective common source lines CSL may be spaced apart from each other and extend in a second direction Y. The same voltage may be electrically applied to the common source lines CSL or different voltages may be applied to the common source lines CSL to be controlled separately.

In an implementation, each of the cell strings CSTR1 to CSTR4 may include ground selection transistors GST connected to the common source line CSL, a plurality of string selection transistors SST1 to SST3 connected to the bit lines BL1 and BL2, and a plurality of memory cell transistors MCT1 to MCT4 interposed between the ground selection transistor GST and the string selection transistor SST1 to SST3. Each of the memory cell transistors MCT1 to MCT4 may include a data storage element. The ground selection transistors GST, the string selection transistors SST1 to SST3 and the memory cell transistors MCT1 to MCT4 may be connected in series.

The common source line CSL may be commonly connected to the sources of the ground selection transistors GST. Further, the ground selection lines GSL, a plurality of word lines WL1 to WLn and the string selection lines SSL1 to SSL3 may be between the common source line CSL and the bit lines BL1 and BL2.

The ground selection line GSL may be used as the gate electrode of the ground selection transistor GST, the plurality of word lines WL1 to WLn may be used as the gate electrodes of the memory cell transistors MCT1 to MCT4, and the string selection lines SSL1 to SSL3 may be used as the gate electrodes of the string selection transistors SST1 to SST3.

In an implementation, the respective string selection lines SSL1 to SSL3 may be separated from each other. In an implementation, the first string selection line SSL1 may include first and second sub-string selection lines SSL1_1 and SSL1_2 separated from each other. The second string selection line SSL2 may include third and fourth sub-string selection lines SSL2_1 and SSL2_2 separated from each other. The third string selection line SSL3 may include fifth and sixth sub-string selection lines SSL3_1 and SSL3_2 separated from each other.

The first sub-string selection line SSL1_1 may form a first sub-string selection transistor SST1_1, and the second sub-string selection line SSL1_2 may form a second sub-string selection transistor SST1_2. The third sub-string selection line SSL2_1 may form a third sub-string selection transistor SST2_1, and the fourth sub-string selection line SSL2_2 may form a fourth sub-string selection transistor SST2_2. The fifth sub-string selection line SSL3_1 may form a fifth sub-string selection transistor SST3_1, and the sixth sub-string selection line SSL3_2 may form a sixth sub-string selection transistor SST3_2.

In an implementation, each of the memory cell transistors MCT1 to MCT4 may be selected separately by the string selection lines SSL1 to SSL3 and controlled. For example, the first memory cell transistor MCT1 may be selected by the first, third, and fifth sub-string selection transistors SST1_1, SST2_1 and SST3_1. The second memory cell transistor MCT2 may be selected by the second, third, and fifth sub-string selection transistors SST1_2, SST2_1 and SST3_1. The third memory cell transistor MCT3 may be selected by the second, third, and sixth sub-string selection transistors SST1_2, SST2_1 and SST3_2. The fourth memory cell transistor MCT4 may be selected by the second, fourth, and sixth sub-string selection transistors SST1_2, SST2_2 and SST3_2.

Therefore, the nonvolatile memory device according to some embodiments may help improve the degree of integration using a plurality of string selection lines SSL1 to SSL3, even without an additional bit line.

Figure 2:
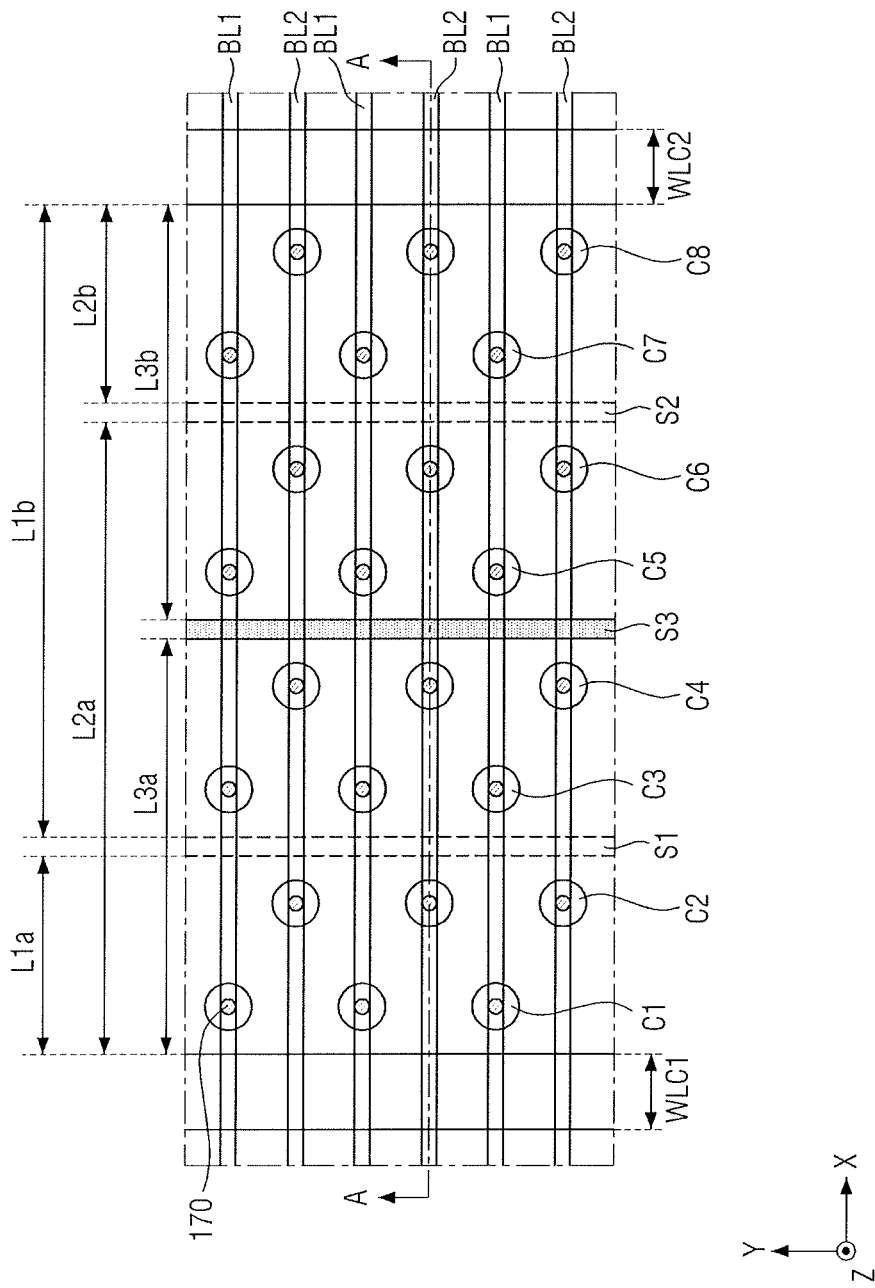
FIG. 2 illustrates a layout diagram of a nonvolatile memory device according to some embodiments.
Figure 3:
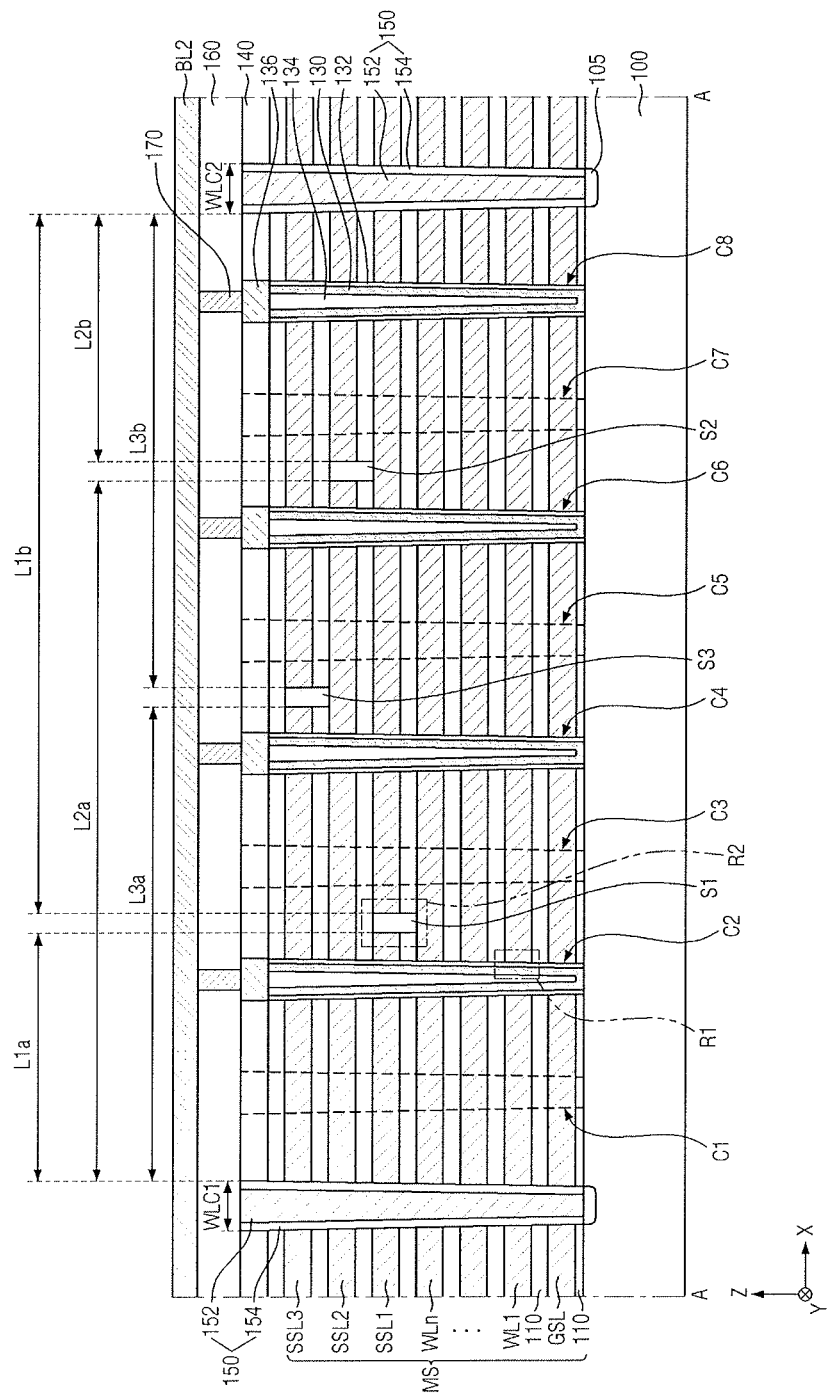
FIG. 3 illustrates a cross-sectional view taken along a line A-A of FIG. 2.
Figure 4:
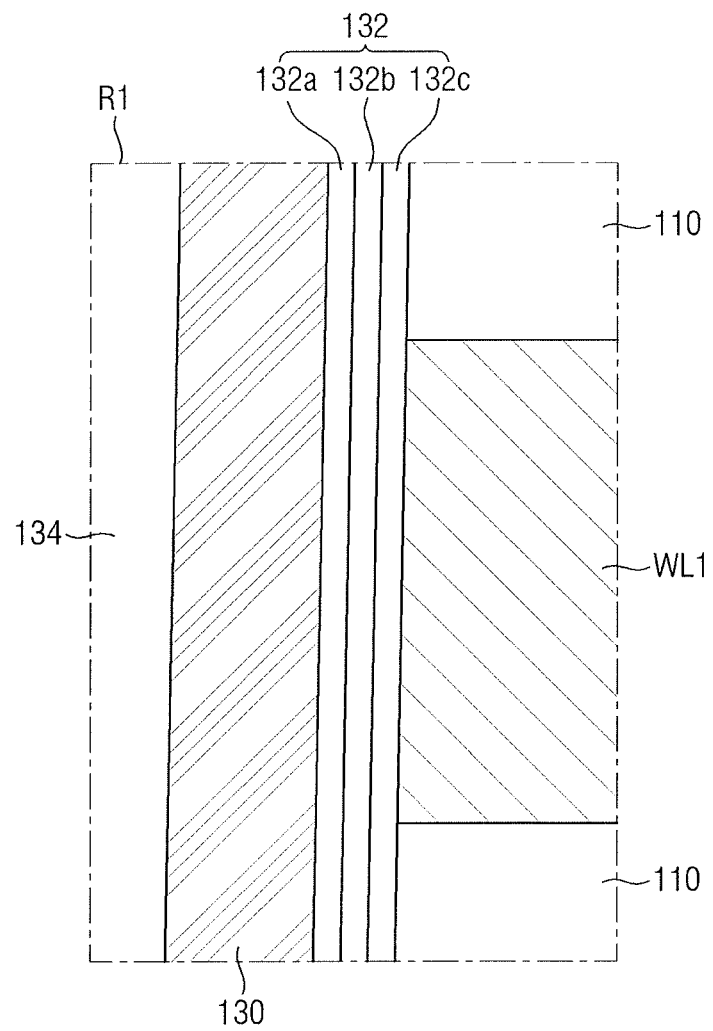
FIG. 4 illustrates an enlarged view of a part R1 of FIG. 3.

FIG. 2 is a layout diagram of a nonvolatile memory device according to some embodiments. FIG. 3 is a cross-sectional view taken along a line A-A of FIG. 2. FIG. 4 is an enlarged view of a part R1 of FIG. 3. FIGS. 5A to 5E are various enlarged views of a part R2 of FIG. 3. FIG. 6 is a schematic partial perspective view of the first to third string selection lines of FIG. 3. For convenience of explanation, repeated parts of contents described above using FIG. 1 may be briefly described or omitted.

Referring to FIGS. 2 to 5E, the nonvolatile memory device according to some embodiments may include a substrate 100, a mold structure MS, a plurality of channel structures C1 to C8, a plurality of cutting lines S1 to S3, and a plurality of bit lines BL1 and BL2.

The substrate 100 may include, e.g., a semiconductor substrate such as a silicon substrate, a germanium substrate, or a silicon-germanium substrate. In an implementation, the substrate 100 may include a silicon-on-insulator (SOI) substrate, a germanium-on-insulator (GOI) substrate, or the like. As used herein, the term "or" is not an exclusive term, e.g., "A or B" would include A, B, or A and B.

The mold structure MS may be on the substrate 100. The mold structure MS may include a plurality of gate electrodes (GSL, WL1 to WLn, and SSL1 to SSL3) and a plurality of insulating patterns 110 stacked on the substrate 100. In an implementation, each of the gate electrodes (GSL, WL1 to WLn, and SSL1 to SSL3) and each insulating pattern 110 may have a layered structure extending in the first direction X and the second direction Y.

The respective gate electrodes (GSL, WL1 to WLn, and SSL1 to SSL3) may be alternately stacked with the respective insulating patterns 110.

In an implementation, a plurality of gate electrodes (GSL, WL1 to WLn, and SSL1 to SSL3) may be stacked in a step pattern. In an implementation, as illustrated in FIG. 3, the plurality of gate electrodes (GSL, WL1 to WLn, and SSL1 to SSL3) may have the same thickness. In an implementation, the plurality of gate electrodes (GSL, WL1 to WLn, and SSL1 to SSL3) may have thicknesses different from each other.

In an implementation, the plurality of gate electrodes (GSL, WL1 to WLn, and SSL1 to SSL3) may include a ground selection line GSL, a plurality of word lines WL1 to WLn, and a plurality of string selection lines SSL1 to SSL3. The ground selection line GSL, the plurality of word lines WL1 to WLn, and the plurality of string selection lines SSL1 to SSL3 may be sequentially stacked on the substrate 100.

In an implementation, as illustrated in FIG. 3, three word lines may be between the ground selection line GSL and the string selection lines SSL1 to SSL3. In an implementation, eight, sixteen, thirty-two, sixth-four or more word lines may be stacked between the ground selection line GSL and the string selection lines SSL1 to SSL3.

In an implementation, a plurality of string selection lines SSL1 to SSL3 may include first to third string selection lines SSL1 to SSL3 sequentially stacked on a plurality of word lines WL1 to WLn. As used herein, the numbering of described elements is not intended to require the elements be provided sequentially. In addition, the numbering of described elements may be changed for ease of description.

In an implementation, the first string selection line SSL1 may be on the uppermost word line WLn. The second string selection line SSL2 may be on the first string selection line SSL1. The third string selection line SSL3 may be on the second string selection line SSL2. In an implementation, the third string selection line SSL3 may be a gate electrode at an uppermost part (e.g., distal to the substrate 100 in a vertical or third direction Z) among the plurality of gate electrodes (GSL, WL1 to WLn, and SSL1 to SSL3).

Each of the gate electrodes (GSL, WL1 to WLn, and SSL1 to SSL3) may include a conductive material. In an implementation, each of the gate electrodes (GSL, WL1 to WLn, and SSL1 to SSL3) may include, e.g., a metal such as tungsten (W), cobalt (Co), nickel (Ni) or a semiconductor material such as silicon.

Each insulating pattern 110 may include an insulating material. In an implementation, each insulating pattern 110 may include, e.g., silicon oxide.

The mold structure MS may be cut by a first cutting region WLC1 and a second cutting region WLC2. Each of the gate electrodes (GSL, WL1 to WLn, and SSL1 to SSL3) may be cut by the first cutting region WLC1 and the second cutting region WLC2. In an implementation, as shown in FIGS. 2 and 3, the first cutting region WLC1 and the second cutting region WLC2 may extend side by side along the second direction Y to form a mold structure MS.

In an implementation, a cutting structure 150 may be in the first cutting region WLC1 and the second cutting region WLC2. As shown in FIG. 3, the cutting structure 150 may penetrate the mold structure MS and extend to the substrate 100 (e.g., in the third direction Z). The cutting structure 150 may extend (e.g., lengthwise) in the second direction Y to cut the mold structure MS. In an implementation, the cutting structure 150 may include a plug pattern 152 and a spacer 154.

The plug pattern 152 may penetrate the mold structure MS and be connected to the substrate 100. In an implementation, the plug pattern 152 may be a common source line (e.g., CSL of FIG. 1) of the nonvolatile memory device according to some embodiments. In an implementation, the plug pattern 152 may include a conductive material. In an implementation, the plug pattern 152 may be connected to the impurity region 105 in the substrate 100. The impurity region 105 may extend, e.g., in the second direction Y.

The spacer 154 may be between the plug pattern 152 and the mold structure MS. In an implementation, the spacer 154 may extend along the side face of the plug pattern 152. The spacer 154 may include an insulating material. The plug pattern 152 may be electrically spaced apart from the plurality of gate electrodes (GSL, WL1 to WLn, and SSL1 to SSL3) of the mold structure MS.

The plurality of channel structures C1 to C8 may penetrate the mold structure MS and intersect the respective gate electrodes (GSL, WL1 to WLn, and SSL1 to SSL3). In an implementation, each of the channel structures C1 to C8 may have a pillar shape extending in the third direction Z intersecting an upper surface of the substrate 100. In an implementation, each of the channel structures C1 to C8 may penetrate the mold structure MS and be connected to the substrate 100. Each of the channel structures C1 to C8 may include a semiconductor pattern 130 and an information storage film 132.

The semiconductor pattern 130 may penetrate the mold structure MS and be connected to the substrate 100. In an implementation, as illustrated in FIG. 3, the semiconductor pattern 130 may have a cup shape. In an implementation, the semiconductor pattern 130 may have various shapes such as a cylindrical shape, a square cylindrical shape, and a sold pillar shape.

The semiconductor pattern 130 may include, e.g., semiconductor materials such as single crystal silicon, polycrystalline silicon, organic semiconductor material, and carbon nanostructure.

The information storage film 132 may be between the semiconductor pattern 130 and each of the gate electrodes (GGS, WL1 to WLn, and SSL1 to SSL3). In an implementation, the information storage film 132 may extend along the side face of the semiconductor pattern 130. In an implementation, as illustrated in FIG. 2, the information storage film 132 may continuously extend along the side face of the semiconductor pattern 130. In an implementation, the information storage film 132 may discontinuously extend on the side face of the semiconductor pattern 130. In an implementation, a part of the information storage film 132 may extend along the upper surface and/or the lower surface of each gate electrodes (GSL, WL1 to WLn, and SSL1 to SSL3).

The information storage film 132 may include, e.g., at least one of silicon oxide, silicon nitride, silicon oxynitride, and a high dielectric constant material having a dielectric constant higher than that of silicon oxide.

In an implementation, the information storage film 132 may include a plurality of films. In an implementation, as shown in FIG. 4, the information storage film 132 may include a tunnel insulating film 132a, a charge storage film 132b, and a blocking insulating film 132c stacked in order on the semiconductor pattern 130. The tunnel insulating film 132a may include, e.g., silicon oxide or a high dielectric constant material (e.g., aluminum oxide ($Al_2O_3$), and hafnium oxide ($HfO_2$)). The charge storage film 132b may include, e.g., silicon nitride. The blocking insulating film 132c may include, e.g., silicon oxide or a high dielectric constant material (e.g., aluminum oxide ($Al_2O_3$), and hafnium oxide ($HfO_2$)).

In an implementation, each of the channel structures C1 to C8 may further include a filling insulating pattern 134. The filling insulating pattern 134 may be formed to fill the inside of the semiconductor pattern 130 having a cup shape. In an implementation, the semiconductor pattern 130 may conformally extend along the side face and the lower surface (e.g., inner surfaces) of the filling insulating pattern 134. The filling insulating pattern 134 may include, e.g., silicon oxide.

In an implementation, each of the channel structures C1 to C8 may further include a channel pad 136. The channel pad 136 may be connected to the upper part of the semiconductor pattern 130 (e.g., a part of the semiconductor pattern 130 that is distal to the substrate 100 in the third direction Z). In an implementation, the channel pad 136 may be in the first interlayer insulating film 140 on the mold structure MS.

In an implementation, as illustrated in FIG. 3, the channel pad 136 may be on the upper surface of the semiconductor pattern 130. In an implementation, the upper part of the semiconductor pattern 130 may extend along the side face of the channel pad 136. The channel pad 136 may include, e.g., polysilicon doped with impurities.

In an implementation, each of the channel structures C1 to C8 may have a tapered shape. In an implementation, the width of each of the channel structures C1 to C8 may increase as it goes away from the substrate 100 (e.g., in the third direction Z). This may be due to the characteristics of the etching process for forming the channel structures C1 to C8.

In an implementation, the plurality of channel structures C1 to C8 may include first to eighth channel structures C1 to C8 that are sequentially (e.g., laterally) arranged along the first direction X between the first cutting region WLC1 and the second cutting region WLC2. In an implementation, the plurality of channel structures C1 to C8 may be arranged in a zigzag shape along the first direction X (e.g., channel structures immediately adjacent in the first direction X may be offset in the second direction Y). In an implementation, the first to eighth channel structures C1 to C8 may be arranged in a line (e.g., aligned linearly) along the first direction X.

A plurality of cutting lines S1 to S3 may be in the mold structure MS between the first cutting region WLC1 and the second cutting region WLC2. In an implementation, the plurality of cutting lines S1 to S3 may be provided in the same number as the plurality of string selection lines SSL1 to SSL3.

In an implementation, three or more string selection lines SSL1 to SSL3 and three or more cutting lines S1 to S3 may be in the mold structure MS. In an implementation, first to third string selection lines SSL1 to SSL3 and first to third cutting lines S1 to S3 may be in the mold structure MS.

The first cutting line S1 may extend, e.g., in the second direction Y and cut the first string selection line SSL1. In an implementation, a part of the first string selection line SSL1 may be on one side of the first cutting line S1, and another part of the first string selection line SSL1 may be on another side of the first cutting line S1. The first string selection line SSL1 on one side of the first cutting line S1 may correspond to the first sub-string selection line SSL1_1 of FIG. 1, and the first string selection line SSL1 on the other side of the first cutting line S1 may correspond to the second sub-string selection line SSL1_2 of FIG. 1.

The first cutting line S1 may re-separate the first string selection line SSL1 separated by the first cutting region WLC1 and the second cutting region WLC2. The first cutting line S1 may be separated from the first cutting region WLC1 by a first distance L1a (in the first direction X), and may be separated from the second cutting region WLC2 by a second distance L1b. As used herein, the separated distance between both components means the shortest distance between two components.

In an implementation, the first distance L1a and the second distance L1b may be different from each other. In an implementation, a first difference between the first distance L1a and the second distance L1b may not be zero. In an implementation, as shown in FIGS. 2 and 3, the second distance L1b may be greater than the first distance L1a.

The first cutting region WLC1, the second cutting region WLC2, and the first cutting line S1 may extend side by side along the second direction Y. In an implementation, from a planar viewpoint (e.g., in plan view and/or when viewed along the third direction Z), a first area (e.g., as defined by dimensions in the first direction X and the second direction Y) of the first string selection line (SSL1 or SSL1_1 of FIG. 1) on one side of the first cutting line S1 may be different from a second area of the first string selection line (SSL1 or SSL1_2 of FIG. 1) on the other side of the first cutting line S1. In an implementation, when the first distance L1a is smaller than the second distance L1b, the first area may be smaller than the second area. In an implementation, the first cutting line S1 may cut the first string selection line SSL1 into unequally sized pieces.

In an implementation, the first cutting line S1 may not cut the second string selection line SSL2. In an implementation, as shown in FIG. 3, the upper surface (e.g., surface facing away from the substrate 100) of the first cutting line S1 may be lower than (e.g., closer to the substrate 100 in the third direction Z) or the same as the lower (e.g., substrate 100-facing) surface of the second string selection line SSL2.

In an implementation, a plurality of channel structures may be between the first cutting line S1 and the first cutting region WLC1 and between the first cutting line S1 and the second cutting region WLC2. In an implementation, as shown in FIGS. 2 and 3, the first and second channel structures C1 and C2 may be between the first cutting line S1 and the first cutting region WLC1, and the third to eighth channel structures C3 to C8 may be between the first cutting line S1 and the second cutting region WLC2.

The second cutting line S2 may extend, e.g., in the second direction Y to cut the second string selection line SSL2. This allows a part of the second string selection line SSL2 to be on one side of the second cutting line S2 and another part of the second string selection line SSL2 to be on another side of the second cutting line S2. The second string selection line SSL2 on one side of the second cutting line S2 may correspond to the third sub-string selection line SSL2_1 of FIG. 1, and the second string selection line SSL2 on the other side of the second cutting line S2 may correspond to the fourth sub-string selection line SSL2_2 of FIG. 1.

The second cutting line S2 may re-separate the second string selection line SSL2 separated by the first cutting region WLC1 and the second cutting region WLC2. The second cutting line S2 may be separated from the first cutting region WLC1 by a third distance L2a and may be separated from the second cutting region WLC2 by a fourth distance L2b (in the first direction X).

In an implementation, the third distance L2a and the fourth distance L2b may be different from each other. In an implementation, a second difference between the third distance L2a and the fourth distance L2b may not be zero. In an implementation, as shown in FIGS. 2 and 3, the fourth distance L2b may be smaller than the third distance L2a. In an implementation, the second difference between the third distance L2a and the fourth distance L2b may be the same as the first difference between the first distance L1a and the second distance L1b. In this specification, the term "same" means not only the completely same case but also a minute difference that may occur due to a process margin or the like.

The first cutting region WLC1, the second cutting region WLC2, and the second cutting line S2 may extend side by side along the second direction Y. From a planar viewpoint, a third area of the second string selection line (SSL2 or SSL2_1 of FIG. 1) on one side of the second cutting line S2 may be different from a fourth area of the second string selection line (SSL2 or SSL2_2 of FIG. 1) on the other side of the second cutting line S2. In an implementation, when the third distance L2a is larger than the fourth distance L2b, the third area may be made larger than the fourth area.

In an implementation, the second cutting line S2 may not cut the first string selection line SSL1 and may not cut the third string selection line SSL3. In an implementation, as shown in FIG. 3, the lower surface of the second cutting line S2 may be higher than or the same as the upper surface of the first string selection line SSL1, and the upper surface of the second cutting line S2 may be lower than or the same as the lower surface of the third string selection line SSL3.

In an implementation, a plurality of channel structures may be between the second cutting line S2 and the first cutting region WLC1, and between the second cutting line S2 and the second cutting region WLC2. In an implementation, as shown in FIGS. 2 and 3, the first to sixth channel structures C1 to C6 may be between the second cutting line S2 and the first cutting region WLC1, and the seventh and eighth channel structures C7 and C8 may be between the second cutting line S2 and the second cutting region WLC2.

The third cutting line S3 may extend, e.g., in the second direction Y to cut the third string selection line SSL3. A part of the third string selection line SSL3 may be on one side of the third cutting line S3, and another part of the third string selection line SSL3 may be on another side of the third cutting line S3. The third string selection line SSL3 on one side of the third cutting line S3 may correspond to the fifth sub-string selection line SSL3_1 of FIG. 1, and the third string selection line SSL3 on the other side of the third cutting line S3 may correspond to the sixth sub-string selection line SSL3_2 of FIG. 1.

The third cutting line S3 may re-separate the third string selection line SSL3 separated by the first cutting region WLC1 and the second cutting region WLC2. The third cutting line S3 may be separated from the first cutting region WLC1 by a fifth distance L3a, and may be separated from the second cutting region WLC2 by a sixth distance L3b (in the first direction X).

In an implementation, a third difference between the fifth distance L3a and the sixth distance L3b may be smaller than the first difference between the first distance L1a and the second distance L1b. In an implementation, the third difference between the fifth distance L3a and the sixth distance L3b may be smaller than the second difference between the third distance L2a and the fourth distance L2b. In an implementation, from a planar viewpoint, the third cutting line S3 may be between the first cutting line S1 and the second cutting line S2.

In an implementation, the fifth distance L3a and the sixth distance L3b may be the same. In an implementation, the third difference between the fifth distance L3a and the sixth distance L3b may be zero.

The first cutting region WLC1, the second cutting region WLC2, and the third cutting line S3 may extend side by side along the second direction Y. From a planar viewpoint, a fifth area of the third string selection line (SSL3 or SSL3_1 of FIG. 1) on one side of the third cutting line S3 may be the same as a sixth area of the third string selection line (SSL3 or SSL3_2 of FIG. 1) on the other side of the third cutting line S3.

In an implementation, the fifth distance L3a and the sixth distance L3b may be greater than the first distance L1a (e.g., the smaller distance among the first distance L1a and the second distance L1b). From a planar viewpoint, the fifth area of the third string selection line (SSL3 or SSL3_1 of FIG. 1) on one side of the third cutting line S3, and the sixth area of the third string selection line (SSL3 or SSL3_2 of FIG. 1) on the other side of the third cutting line S3 may be greater than the first area of the first string selection line (SSL1 or SSL1_1 of FIG. 1) on one side of the first cutting line S1, respectively.

In an implementation, the fifth distance L3a and the sixth distance L3b may be greater than the fourth distance L2b (e.g., the smaller distance among the third distance L2a and the fourth distance L2b). From a planar viewpoint, the fifth area of the third string selection line (SSL3 or SSL3_1 of FIG. 1) on one side of the third cutting line S3, and the sixth area of the third string selection line (SSL3 or SSL3_2 of FIG. 1) on the other side of the third cutting line S3 may be larger than the fourth area of the second string selection line (SSL2 or SSL2_2 of FIG. 1) on the other side of the second cutting line S2, respectively.

In an implementation, the third cutting line S3 may not cut the first string selection line SSL1 and may not cut the second string selection line SSL2. In an implementation, as shown in FIG. 3, the lower surface of the third cutting line S3 may be higher (e.g., farther from the substrate 100 in the third direction X) than or the same as the upper surface of the second string selection line SSL2.

In an implementation, a plurality of channel structures may be between the third cutting line S3 and the first cutting region WLC1, and between the third cutting line S3 and the second cutting region WLC2. In an implementation, as shown in FIGS. 2 and 3, the first to fourth channel structures C1 to C4 may be between the third cutting line S3 and the first cutting region WLC1, and the fifth to eighth channel structures C5 to C8 may be between the third cutting line S3 and the second cutting region WLC2.

In an implementation, the first to third cutting lines S1 to S3 may not overlap each other from a planar viewpoint (e.g., when viewed in plan view and/or along the third direction X). In an implementation, the third cutting line S3 may be separated from the first cutting line S1 in the first direction X, and the second cutting line S2 may be separated from the third cutting line S3 in the first direction X.

In the nonvolatile memory device according to some embodiments, any string selection line may not be cut by the plurality of cutting lines. In an implementation, the first string selection line SSL1 may be cut only by a single cutting line (the first cutting line S1), the second string selection line SSL2 may be cut only by a single cutting line (the second cutting line S2), and the third string selection line SSL3 may be cut only by a single cutting line (the third cutting line S3).

The first to third cutting lines S1 to S3 may include an insulating material. The first to third cutting lines S1 to S3 may each independently include, e.g., silicon oxide, silicon nitride, or silicon oxynitride.

The plurality of bit lines BL1 and BL2 may be connected to the plurality of channel structures C1 to C8. In an implementation, each of the bit lines BL1 and BL2 may be connected to corresponding ones of the channel structures C1 to C8 through the bit line contact 170. For example, the bit line contact 170 may penetrate the second interlayer insulating film 160 on the mold structure MS to electrically connect each of the channel structures C1 to C8 and a corresponding one of the bit lines BL1 and BL2.

In an implementation, each of the bit lines BL1 and BL2 may intersect the first to third cutting lines S1 to S3. In an implementation, each of the bit lines BL1 and BL2 may extend (e.g., lengthwise) in the first direction X.

In an implementation, each of the bit lines BL1 and BL2 may be connected to a plurality of channel structures arranged in a line. In an implementation, the first bit line BL1 may be connected to the first, third, fifth, and seventh channel structures C1, C3, C5, and C7, and the second bit line BL2 may be connected to the second, fourth, sixth, and eighth channel structures C2, C4, C6, and C8.

Various shapes of the first to third cutting lines S1 to S3 according to some embodiments will be described below with reference to FIGS. 5A to 5E. Although FIGS. 5A to 5E show only the first cutting line S1, the second cutting line S2 and the third cutting line S3 may have the same shape.

Figure 5A:
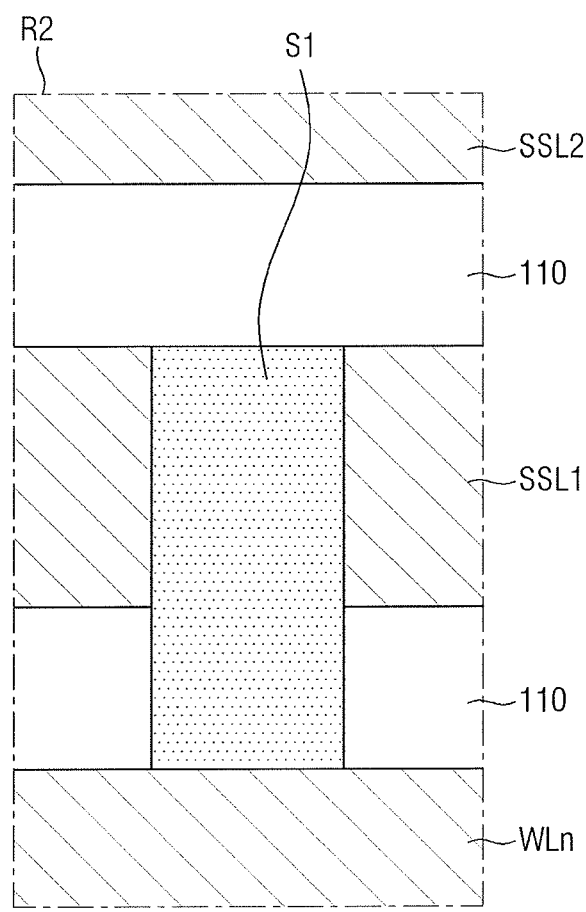
FIGS. 5A to 5E illustrate various enlarged views of a part R2 of FIG. 3.
Figure 6:
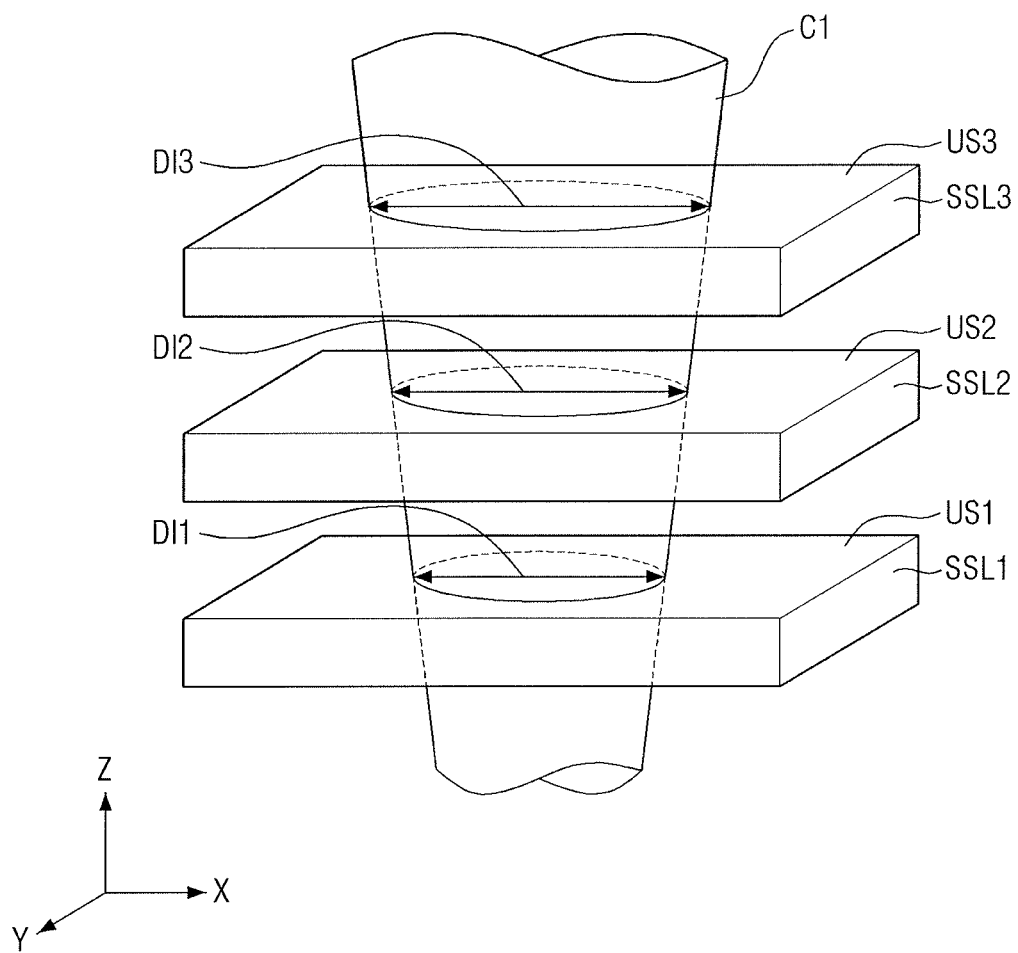
FIG. 6 illustrates a schematic partial perspective view of the first to third string selection lines of FIG. 3.

Referring to FIG. 5A, in some embodiments, the lower (e.g., substrate 100-facing) surface of the first cutting line S1 may be lower (e.g., closer to the substrate 100 in the third direction Z) than the lower surface of the first string selection line SSL1. In an implementation, the first cutting line S1 may penetrate the insulating pattern 110 below the first string selection line SSL1. In an implementation, the lower surface of the first cutting line S1 may be in contact with the upper surface of the gate electrode (e.g., a word line WLn) below the first string selection line SSL1.

Figure 5B:
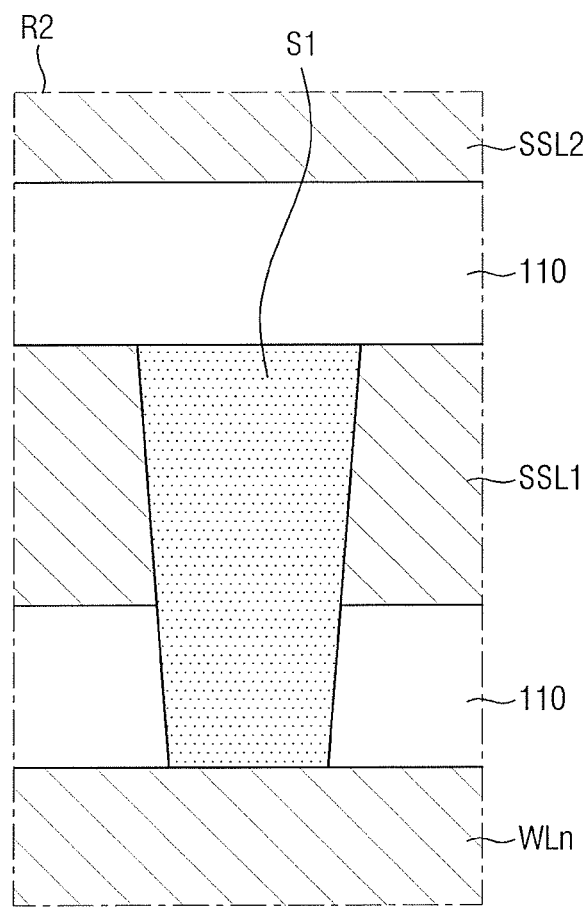

Referring to FIG. 5B, in some embodiments, the first cutting line S1 may have a tapered shape. For example, the width of the first cutting line S1 may increase as it goes away from the word line WLn below the first string selection line SSL1 (e.g., the width of the first cutting line S1 as measured in the first direction X may increase from a substrate 100-facing surface thereof in the third direction Z). This may be due to the characteristics of the etching process for forming the first cutting line S1.

Figure 5C:
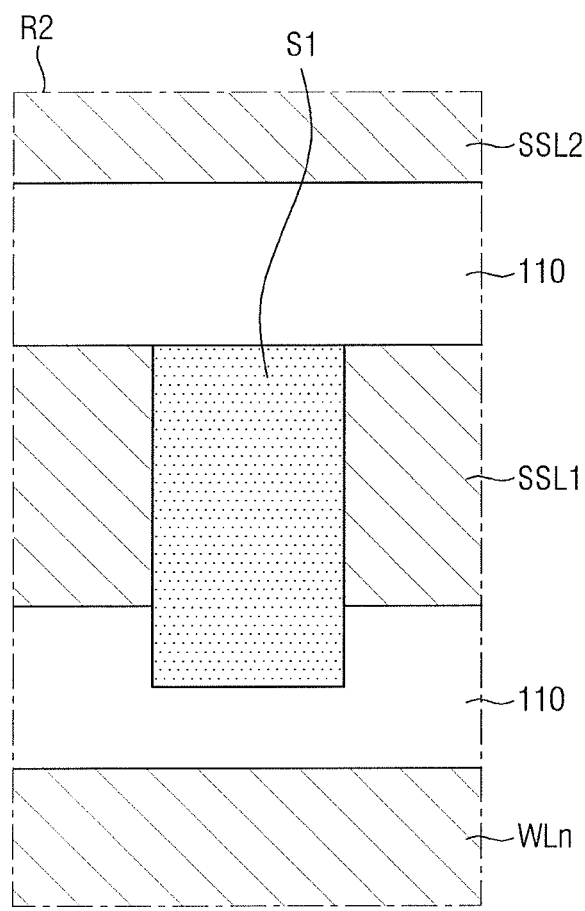

Referring to FIG. 5C, in some embodiments, the lower surface of the first cutting line S1 may be higher than the lower surface of the insulating pattern 110 below the first string selection line SSL1. In an implementation, the lower part of the first cutting line S1 may be embedded in the insulating pattern 110 below the first string selection line SSL1. In an implementation, the lower surface of the first cutting line S1 may not contact the upper surface of the gate electrode (e.g., the word line WLn) below the first string selection line SSL1.

Figure 5D:
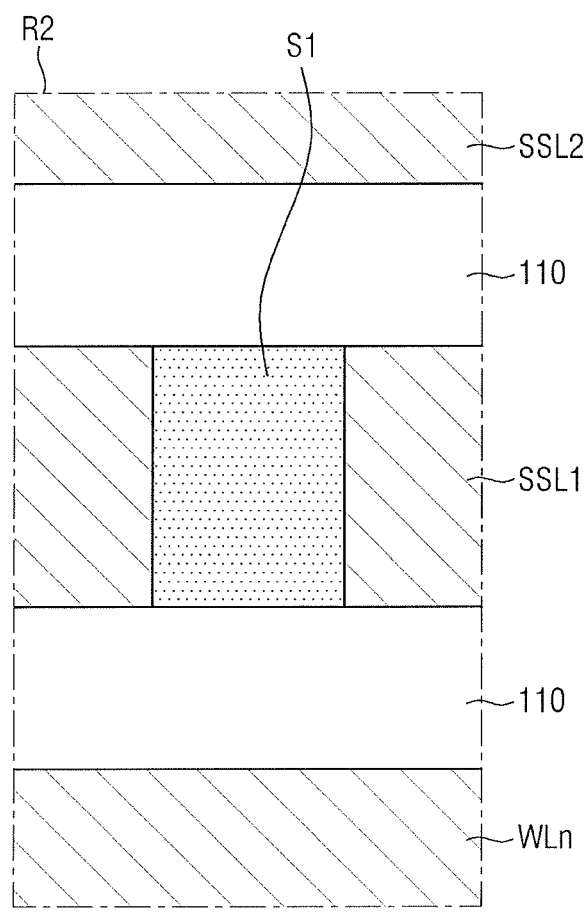

Referring to FIG. 5D, in some embodiments, the lower surface of the first cutting line S1 may be on the same plane as the lower surface of the first string selection line SSL1. In an implementation, the lower surface of the first cutting line S1 may be in contact with the upper surface of the insulating pattern 110 below the first string selection line SSL1.

Figure 5E:
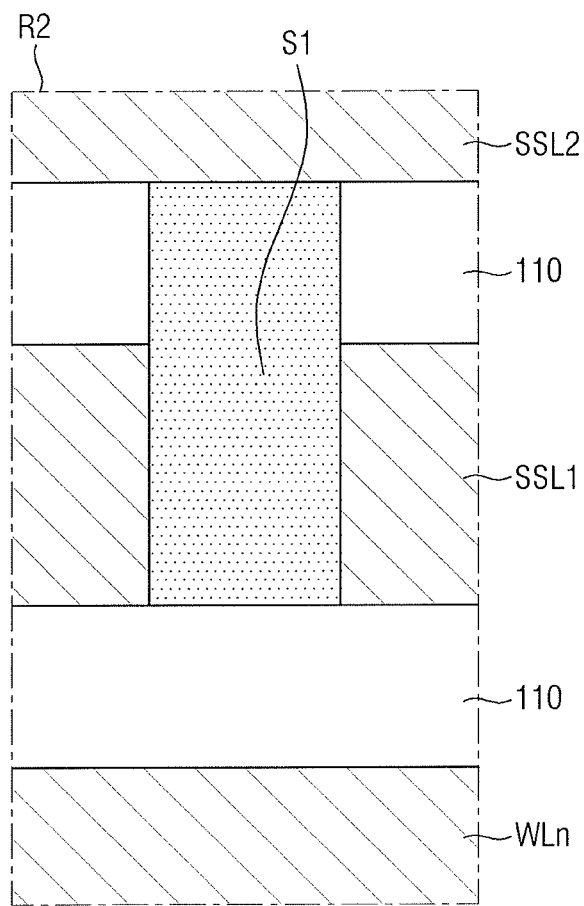

Referring to FIG. 5E, in some embodiments, the upper surface of the first cutting line S1 may be higher than the upper surface of the first string selection line SSL1. In an implementation, the first cutting line S1 may penetrate the insulating pattern 110 on the first string selection line SSL1 (e.g., the insulating pattern 110 that is between the first string selection line SSL1 and the second string selection line SSL2). In an implementation, the upper surface of the first cutting line S1 may contact the lower surface of the gate electrode (e.g., the second string selection line SSL2) on the first string selection line SSL1.

The nonvolatile memory device according to some embodiments may help improve the degree of integration, using a plurality of string selection lines SSL1 to SSL3 and a plurality of cutting lines S1 to S3 for cutting them, even without an additional bit line. The electrical resistance per unit thickness of the string selection line may increase, as the string selection line is cut from a planar viewpoint. The electrical resistance per unit thickness may further increase in the string selection line (or the sub-string selection line) on the upper part due to the channel structure having a tapered shape.

In an implementation, as shown in FIG. 6, the first channel structure C1 may penetrate the first to third string selection lines SSL1 to SSL3. The width of the first channel structure C1 may be narrowed downward (e.g., with increasing proximity to the substrate 100 in the third direction Z).

In an implementation, a diameter DI1 of the first channel structure C1 intersecting the first string selection line SSL1 may be smaller than a diameter DI2 of the first channel structure C1 intersecting the second string selection line SSL2. In an implementation, a diameter DI2 of the first channel structure C1 intersecting the second string selection line SSL2 may be smaller than a diameter DI3 of the first channel structure C1 intersecting the third string selection line SSL3.

From a planar viewpoint, the area of the string selection lines may decrease upward (e.g., with increasing distance from the substrate 100 in the third direction Z). In an implementation, as illustrated in FIG. 6, an area of the upper surface US2 of the second string selection line SSL2 may be smaller than an area of the upper surface US1 of the first string selection line SSL1. In an implementation, as illustrated in FIG. 6, an area of the upper surface US3 of the third string selection line SSL3 may be smaller than an area of the upper surface US2 of the second string selection line SSL2. The electrical resistance per unit thickness may further increase in the string selection line (or the sub-string selection line) at the upper part of the device (e.g., distal to the substrate 100 in the third direction Z).

In the nonvolatile memory device according to some embodiments, by maintaining a large area of the string selection line (or the sub-string selection line) at the upper part of the device, even when the string selection line is cut by the cutting lines, it is possible to help improve the operating performance and reliability of the nonvolatile memory device.

In an implementation, as described above, the third string selection line SSL3 in the upper part may be cut by the third cutting line S3. The third difference between the fifth distance L3a and the sixth distance L3b may be smaller than the first difference between the first distance L1a and the second distance L1b, and smaller than the second different between the third distance L2a and the fourth distance L2b. As a result, the area of the third string selection line SSL3 at sides of the third cutting line S3 may be kept wide. In an implementation, from a planar viewpoint, the first area of the third string selection line (SSL3 or SSL3_1 of FIG. 1) on one side of the third cutting line S3, and the second area of the third string selection line (SSL3 or SSL3_2 of FIG. 1) on the other side of the third cutting line S3 may be kept wide.

As a result, a nonvolatile memory device in which the electrical resistance per unit thickness of the string selection line (or the sub-string selection line) in the upper part may be improved, and operating performance and reliability are improved may be provided.

Figure 7:
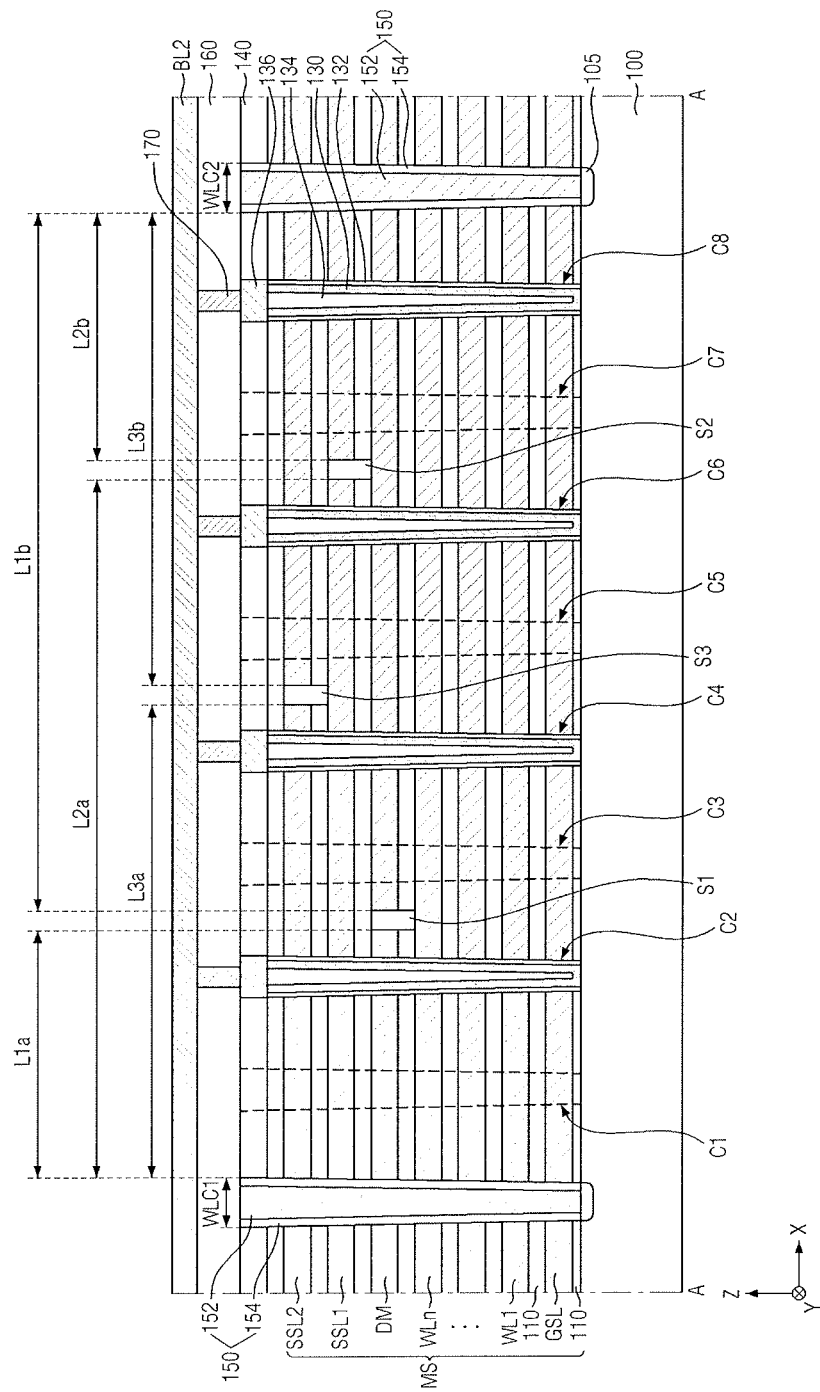
FIG. 7 illustrates a cross-sectional view of a nonvolatile memory device according to some embodiments.

FIG. 7 is a cross-sectional view of a nonvolatile memory device according to some embodiments. For convenience of explanation, repeated parts of contents described above using FIGS. 1 to 6 may be briefly described or omitted.

Referring to FIG. 7, in the nonvolatile memory device according to some embodiments, the mold structure MS may further include a dummy word line DM.

The dummy word line DM may be between, e.g., the uppermost word line WLn and the first string selection line SSL1.

In an implementation, the first cutting line S1 may cut the dummy word line DM, the second cutting line S2 may cut the first string selection line SSL1, and the third cutting line S3 may cut the second string selection line SSL2.

In an implementation, the third difference between the fifth distance L3a and the sixth distance L3b may be smaller than the first difference between the first distance L1a and the second distance L1b. In an implementation, the third difference between the fifth distance L3a and the sixth distance L3b may be smaller than the second difference between the third distance L2a and the fourth distance L2b. In an implementation, from a planer viewpoint, the third cutting line S3 may be between the first cutting line S1 and the second cutting line S2.

In an implementation, the second string selection line SSL2 may be a gate electrode at the uppermost part of a plurality of gate electrodes (GSL, WL1 to WLn, DM, SSL1, and SSL2).

Figure 8:
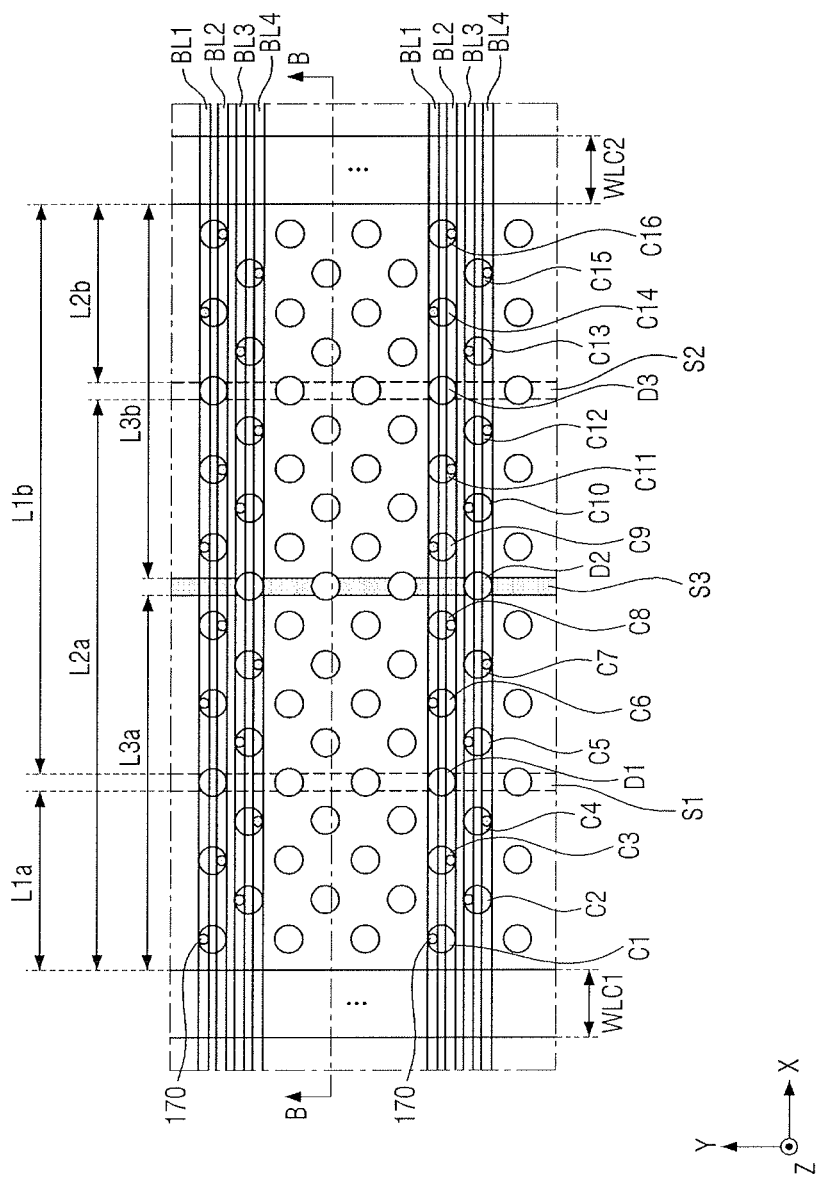
FIG. 8 illustrates a layout diagram of a nonvolatile memory device according to some embodiments.
Figure 9:
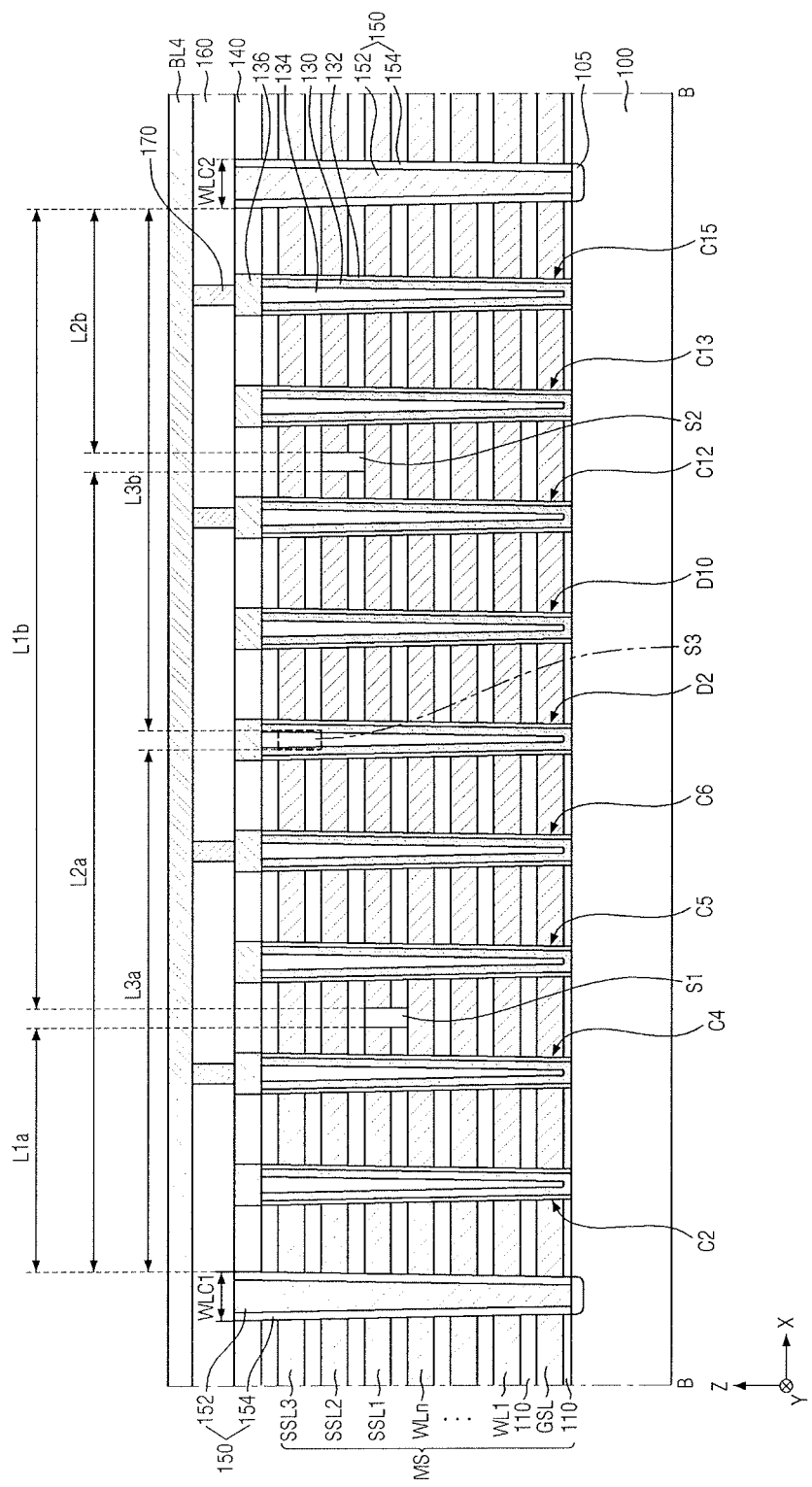
FIGS. 9 and 10 illustrate various cross-sectional views taken along a line B-B of FIG. 8.
Figure 10:
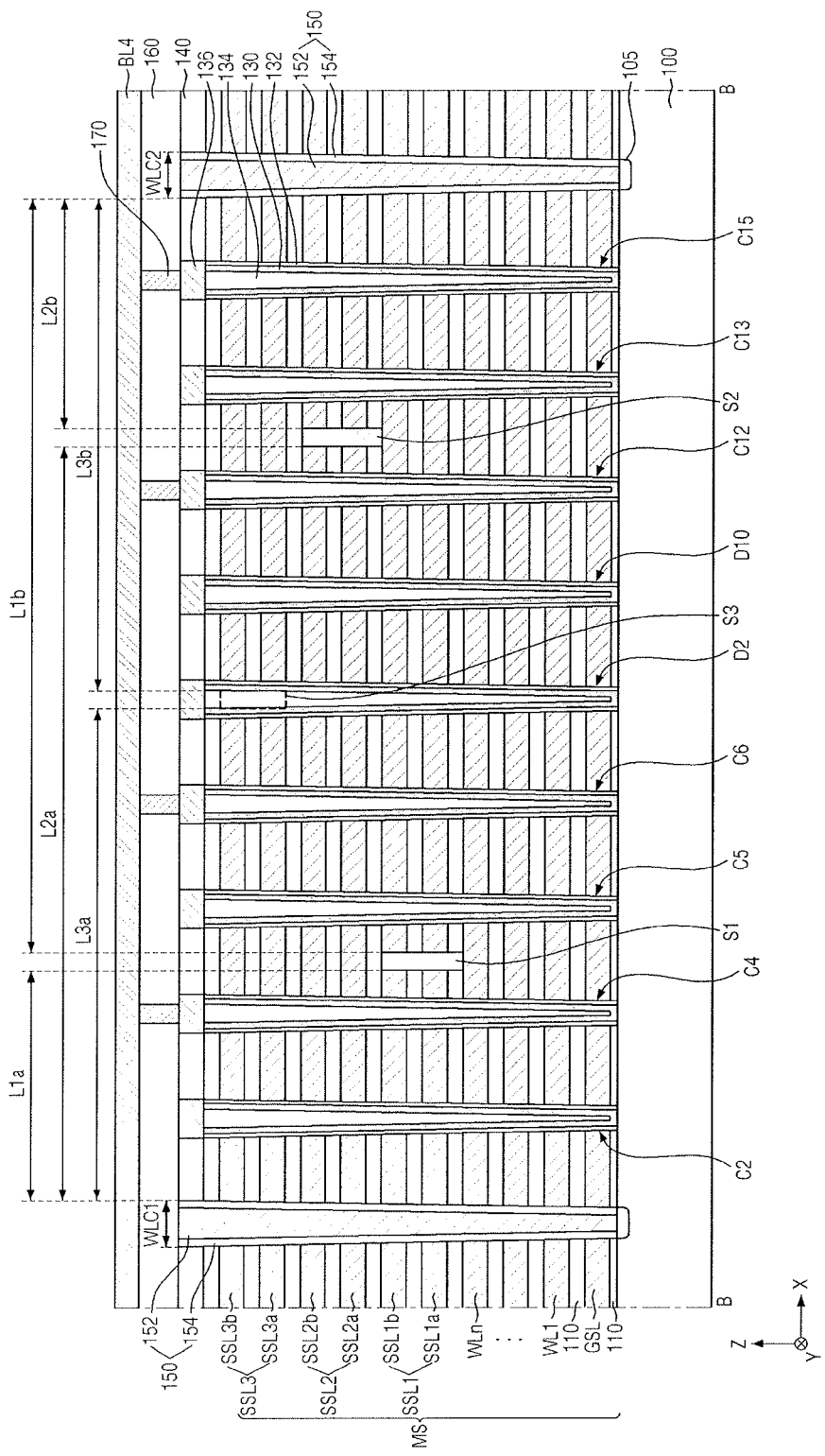

FIG. 8 is a layout diagram of a nonvolatile memory device according to some embodiments. FIGS. 9 and 10 are various cross-sectional views taken along a line B-B of FIG. 8. For convenience of explanation, repeated parts of contents described above using FIGS. 1 to 7 may be briefly described or omitted.

Referring to FIGS. 8 and 9, the nonvolatile memory device according to some embodiments may further include dummy channel structures D1 to D3.

The dummy channel structures D1 to D3 may penetrate the mold structure MS and intersect the respective gate electrodes (GSL, WL1 to WLn, and SSL1 to SSL3). In an implementation, the dummy channel structures D1 to D3 may have the same shape as that of the channel structures C1 to C16. In an implementation, the dummy channel structures D1 to D3 may have a pillar shape extending in the third direction Z. In an implementation, the dummy channel structures D1 to D3 may include a semiconductor pattern 130 and an information storage film 132.

In an implementation, the dummy channel structures D1 to D3 may cross the first to third cutting lines S1 to S3. In an implementation, the dummy channel structures D1 to D3 may include a first dummy channel structure D1 that crosses the first cutting line S1, a second dummy channel structure D2 that crosses the third cutting line SS3, and a third dummy channel structure D3 that crosses the second cutting line S2.

In an implementation, as illustrated in the drawing, each of the three dummy channel structures D1 to D3 may cross one of the first to third cutting lines S1 to S3. In an implementation, at least one of the first to third dummy channel structures D1 to D3 may be omitted.

In an implementation, the plurality of channel structures C1 to C8 may include first to sixteenth channel structures C1 to C16 sequentially and laterally arranged along the first direction X between the first cutting region WLC1 and the second cutting region WLC2.

In an implementation, the device may include the first to sixteenth channel structures C1 to C16, and the first to third dummy channel structures D1 to D3 arranged along the first direction X in a zigzag shape.

In an implementation, first to fourth channel structures C1 to C4 may be between the first cutting line S1 and the first cutting region WLC1, and the fifth to sixteenth channel structures C5 to C16 may be between the first cutting line S1 and the second cutting region WLC2.

In an implementation, first to twelfth channel structures C1 to C12 may be between the second cutting line S2 and the first cutting region WL1, and thirteenth to sixteenth channel structures C13 to C16 may be between the second cutting line S2 and the second cutting region WLC2.

In an implementation, first to eighth channel structures C1 to C8 may be between the third cutting line S3 and the first cutting region WLC1, and ninth to sixteenth channel structures C9 to C16 may be between the third cutting line S3 and the second cutting region WLC2.

As more channel structures C1 to C16 are between the first cutting region WLC1 and the second cutting region WLC2, a larger number of bit lines may be on the channel structures C1 to C16. In an implementation, the bit lines BL1 to BL4 of FIG. 8 may be larger than the bit lines BL1 and BL2 of FIG. 2.

In an implementation, each of the bit lines BL1 to BL4 may be connected to a plurality of channel structures arranged in a row. In an implementation, the first bit line BL1 may be connected to the first, sixth, ninth and fourteenth channel structures C1, C6, C9 and C14. The second bit line BL2 may be connected to the third, eighth, eleventh and sixteenth channel structures C3, C8, C11 and C16. The third bit line BL3 may be connected to the second, fifth, tenth and thirteenth channel structures C2, C5, C10 and C13. The fourth bit line BL4 may be connected to the fourth, seventh, twelfth and fifteenth channel structures C4, C7, C12 and C15.

In an implementation, the dummy channel structures D1 to D3 may not be connected to the plurality of bit lines BL1 to BL4. In an implementation, the bit line contact 170 may not be on the dummy channel structures D1 to D3.

Referring to FIGS. 8 and 10, in the nonvolatile memory device according to some embodiments, the first to third cutting lines S1 to S3 may cut a plurality of strings, respectively.

In an implementation, the first string selection line SSL1 may include a first lower string selection line SSL1a and a first upper string selection line SSL1b. The first lower string selection line SSL1a and the first upper string selection line SSL1b may be sequentially stacked on the uppermost word line WLn. In an implementation, the first cutting line S1 may cut both the first lower string selection line SSL1a and the first upper string selection line SSL1b.

In an implementation, the second string selection line SSL2 may include a second lower string selection line SSL2a and a second upper string selection line SSL2b. The second lower string selection line SSL2a and the second upper string selection line SSL2b may be sequentially stacked on the first string selection line SSL1. In an implementation, the second cutting line S2 may cut both the second lower string selection line SSL2a and the second upper string selection line SSL2b.

In an implementation, the third string selection line SSL3 may include a third lower string selection line SSL3a and a third upper string selection line SSL3b. The third lower string selection line SSL3a and the third upper string selection line SSL3b may be sequentially stacked on the second string selection line SSL2. In an implementation, the third cutting line S3 may cut both the third lower string selection line SSL3a and the third upper string selection line SSL3b.

In an implementation, each of the first to third cutting lines S1 to S3 may cut two string selection lines. In an implementation, each of the first to third cutting lines S1 to S3 may, e.g., cut three or more string selection lines.

In an implementation, all of the first to third cutting lines S1 to S3 may cut the two string selection lines. In an implementation, at least one of the first to third cutting lines S1 to S3 may cut only one string selection line.

Figure 11:
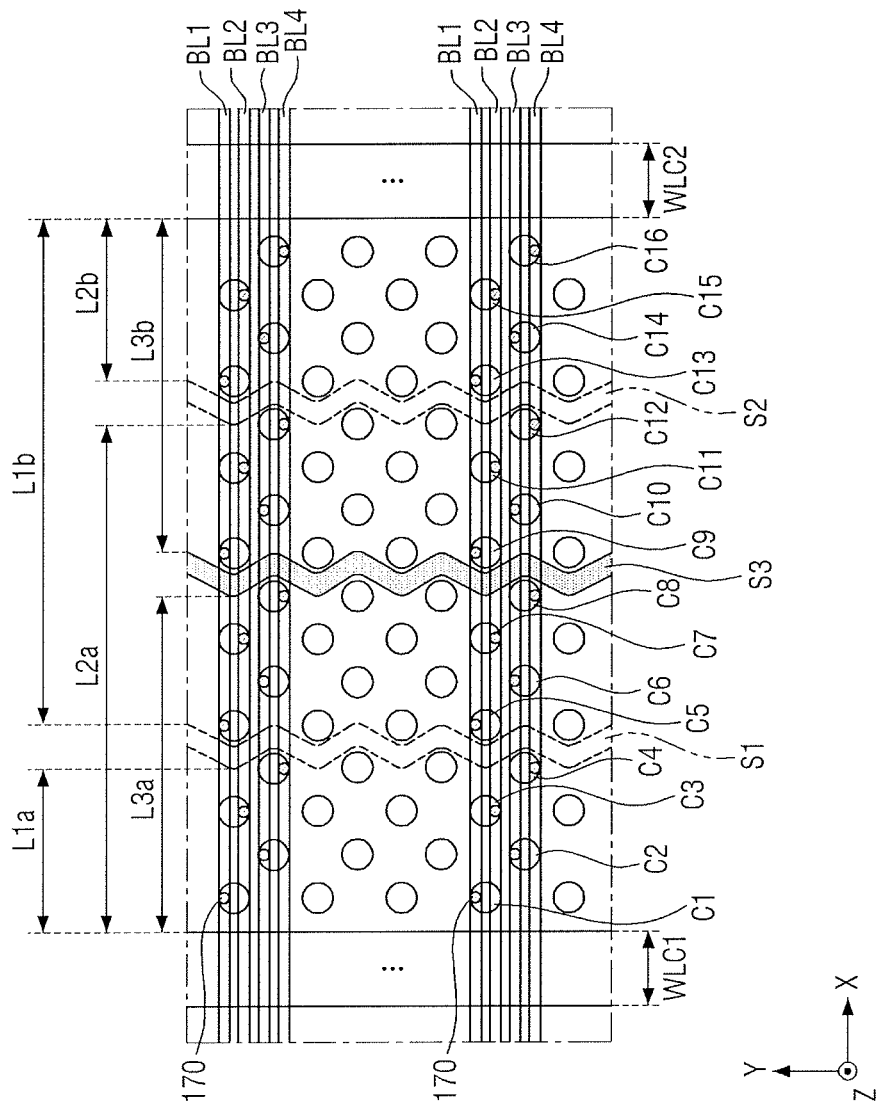
FIG. 11 illustrates a layout diagram of the nonvolatile memory device according to some embodiments.

FIG. 11 is a layout diagram of the nonvolatile memory device according to some embodiments. For convenience of explanation, repeated parts of contents described above using FIGS. 1 to 10 may be briefly described or omitted.

Referring to FIG. 11, in the nonvolatile memory device according to some embodiments, each of the first to third cutting lines S1 to S3 may have a zigzag shape from a planar viewpoint.

In an implementation, the first cutting line S1 may meanderingly cross between the fourth channel structure C4 and the fifth channel structure C5. In an implementation, the second cutting line S2 may meanderingly cross between the twelfth channel structure C12 and the thirteenth channel structure C13. In an implementation, the third cutting line S3 may meanderingly cross between the eighth channel structure C8 and the ninth channel structure C9.

In an implementation, each of the first to third cutting lines S1 to S3 may extend lengthwise along the second direction Y in a zigzag shape from a planar viewpoint.

In an implementation, all of the first to third cutting lines S1 to S3 may have a zigzag shape. In an implementation, at least one of the first to third cutting lines S1 to S3 may extend in a straight line along the second direction Y.

In this embodiment, the dummy channel structure (e.g., D1, D2, and D3 of FIG. 8) may not be formed between the first cutting region WLC1 and the second cutting region WLC2, and a nonvolatile memory device with further improved degree of integration may be provided.

Figure 12:
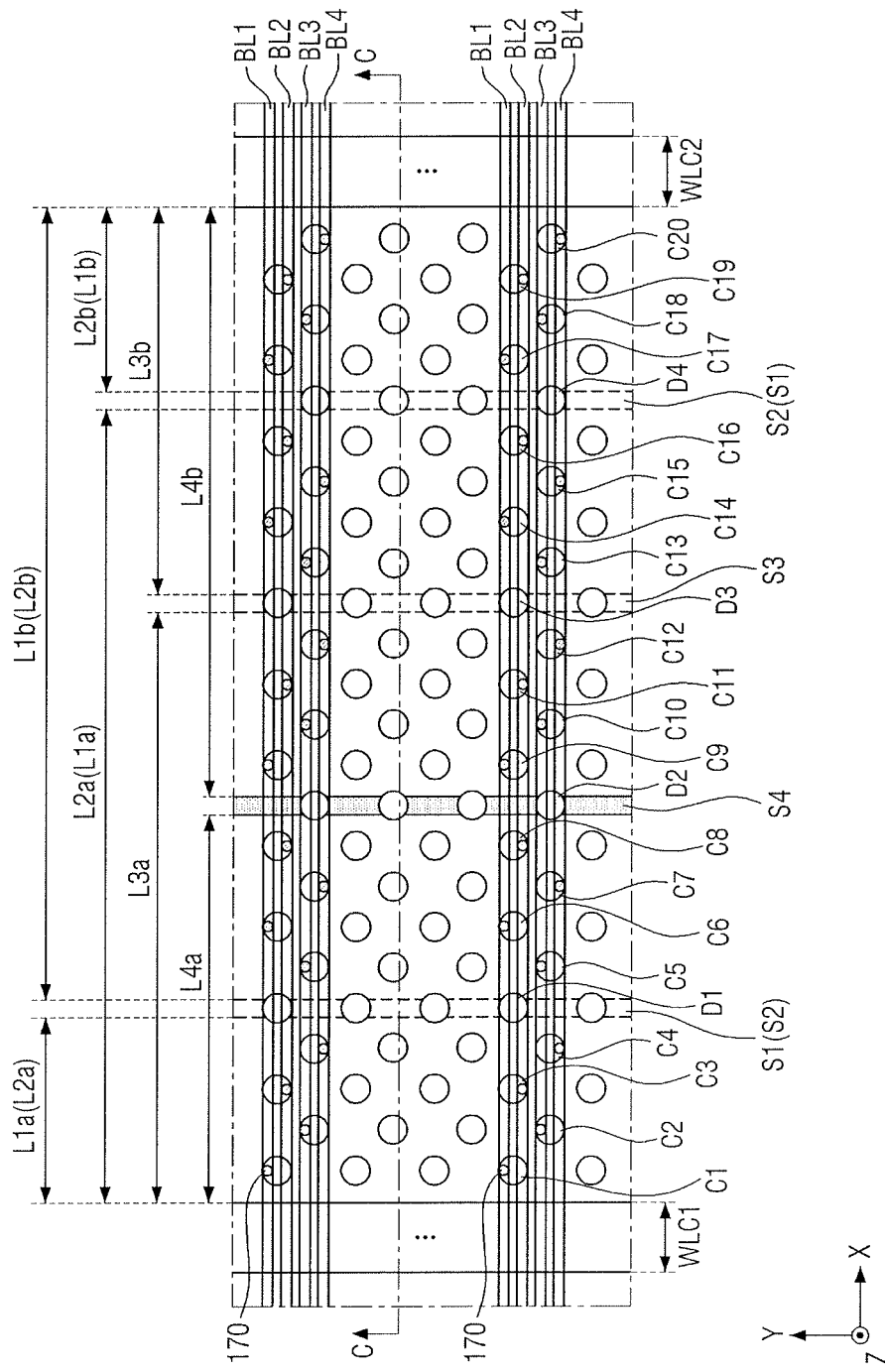
FIG. 12 illustrates a layout diagram of a nonvolatile memory device according to some embodiments.
Figure 13:
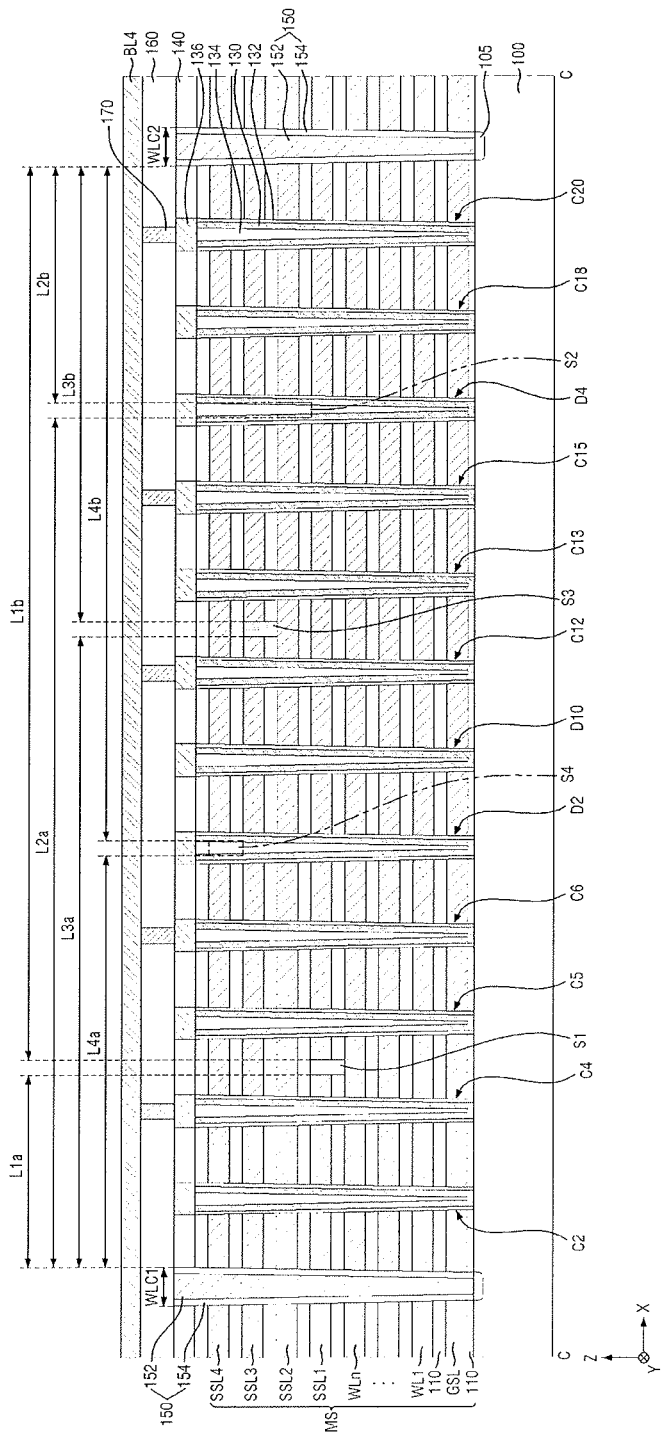
FIGS. 13 and 14 illustrate various cross-sectional views taken along a line C-C of FIG. 12.
Figure 14:
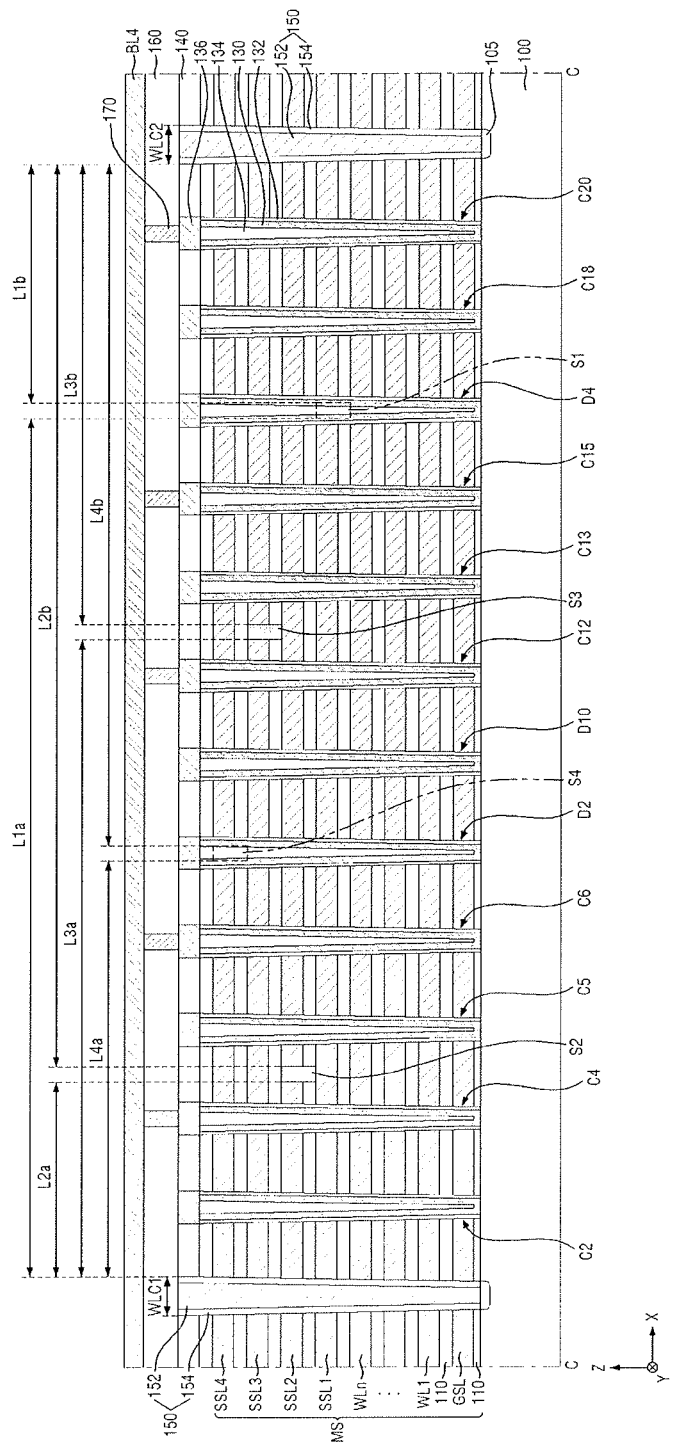

FIG. 12 is a layout diagram of a nonvolatile memory device according to some embodiments. FIGS. 13 and 14 are various cross-sectional views taken along a line C-C of FIG. 12. For convenience of explanation, repeated parts of contents described above using FIGS. 1 to 11 may be briefly described or omitted.

Referring to FIGS. 12 and 13, the nonvolatile memory device according to some embodiments may further include a fourth string selection line SSL4 and a fourth cutting line S4.

The fourth string selection line SSL4 may be on the third string selection line SSL3. In an implementation, the fourth string selection line SSL4 may be a gate electrode at the uppermost part among the plurality of gate electrodes (GSL, WL1 to WLn, and SSL1 to SSL4).

The fourth cutting line S4 may extend, e.g., in the second direction Y to cut the fourth string selection line SSL4.

The fourth cutting line S4 may re-separate the fourth string selection line SSL4 separated by the first cutting region WLC1 and the second cutting region WLC2. The fourth cutting line S4 may be separated from the first cutting region WLC1 by a seventh distance L4a, and may be separated from the second cutting region WLC2 by an eighth distance L4b (e.g., in the first direction X).

In an implementation, the fifth distance L3a and the sixth distance L3b may be different from each other. In an implementation, the third difference between the fifth distance L3a and the sixth distance L3b may not be zero. In an implementation, as shown in FIG. 13, the sixth distance L3b may be smaller than the fifth distance L3a.

In an implementation, the seventh distance L4a and the eighth distance L4b may be different from each other. In an implementation, the fourth difference between the seventh distance L4a and the eighth pattern L4b may not be zero. In an implementation, as shown in FIG. 13, the eighth distance L4b may be greater than the seventh distance L4a.

In an implementation, the fourth difference between the seventh distance L4a and the eighth distance L4b may be smaller than the first difference between the first distance L1a and the second distance L1b, and smaller than the second difference between the third distance L2a and the fourth distance L2b. In an implementation, from a planar viewpoint, the fourth cutting line S4 may be between the first cutting line S1 and the second cutting line S2.

In an implementation, the fourth difference between the seventh distance L4a and the eighth path L4b may be the same as the third difference between the fifth distance L3a and the sixth distance L3b. In an implementation, the seventh distance L4a may be the same as the sixth distance L3b, and the eighth distance L4b may be the same as the fifth distance L3a.

Referring to FIGS. 12 and 14, in the nonvolatile memory device according to some embodiments, the second distance L1b may be smaller than the first distance L1a, and the fourth distance L2b may be greater than the third distance L2a.

In an implementation, from a planar viewpoint, the positions of the first cutting line S1 and the second cutting line S2 of FIG. 14 may be in the form in which the positions of the first cutting line S1 and the second cutting line S2 of FIG. 13 are changed from each other.

In an implementation, the fourth difference between the seventh distance L4a and the eighth distance L4b may be smaller than the first difference between the first distance L1a and the second distance L1b, and smaller than the third difference between the fifth distance L3a and the sixth distance L3b. In an implementation, from a planar viewpoint, the fourth cutting line S4 may be between the first cutting line S1 and the second cutting line S2.

Figure 15:
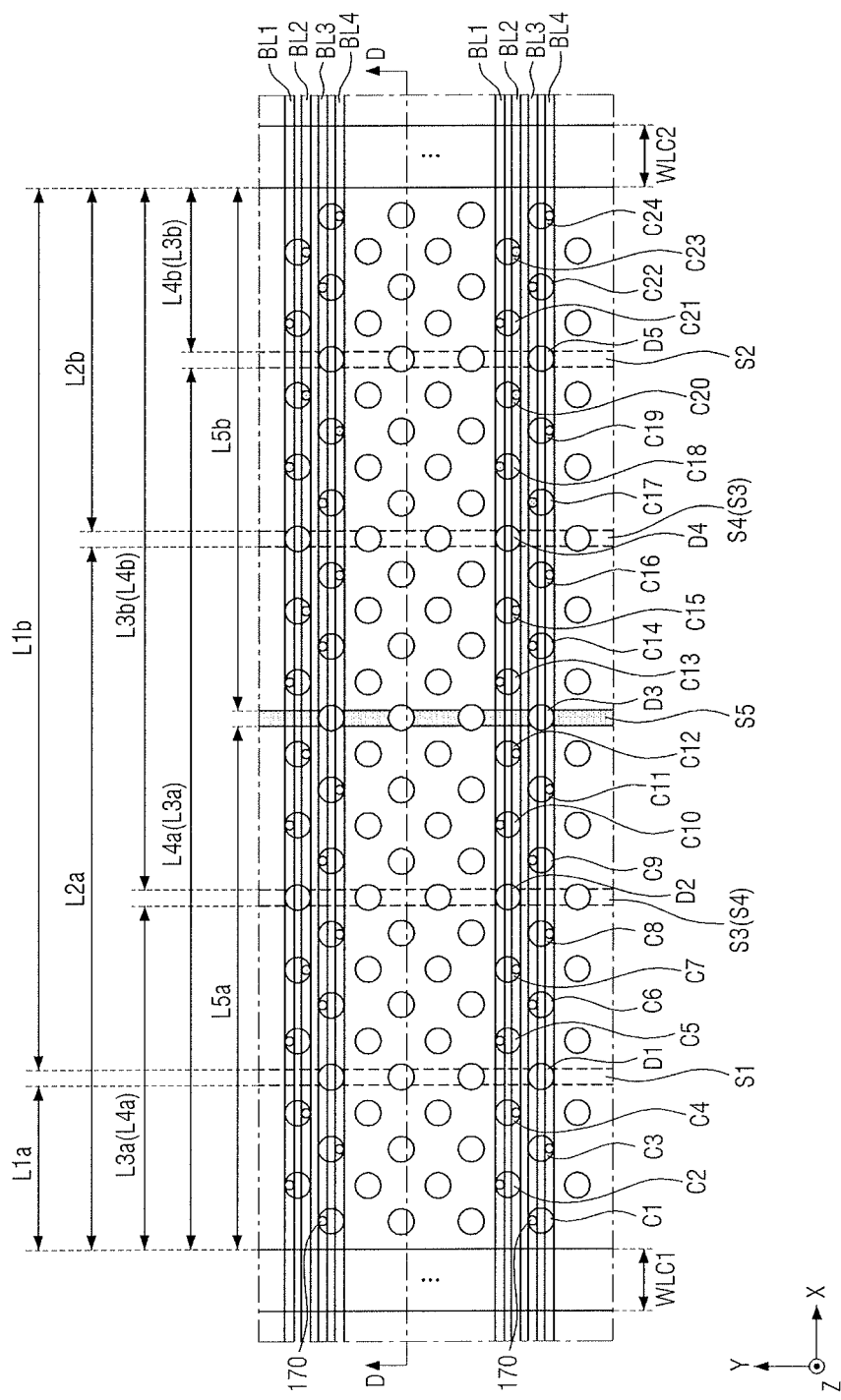
FIG. 15 illustrates a layout diagram of a nonvolatile memory device according to some embodiments.
Figure 16:
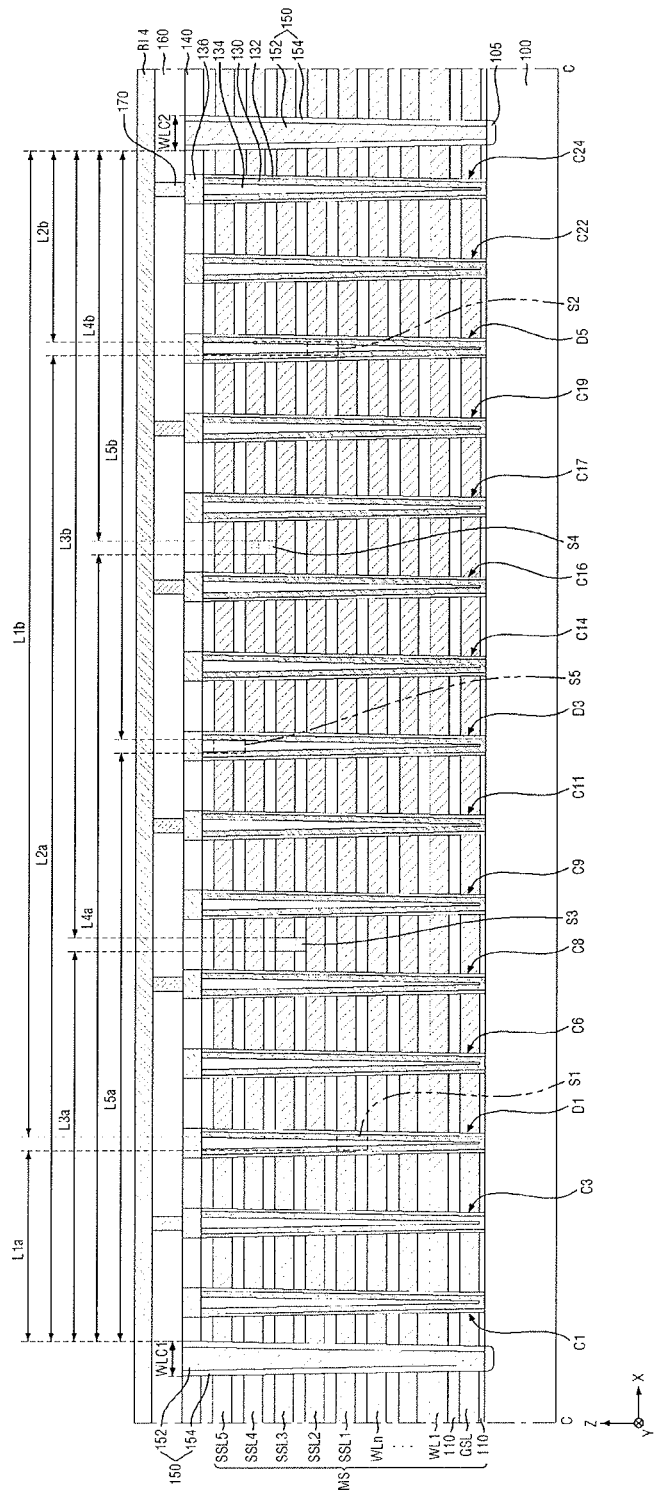
FIGS. 16 and 17 illustrate various cross-sectional views taken along a line D-D of FIG. 15.
Figure 17:
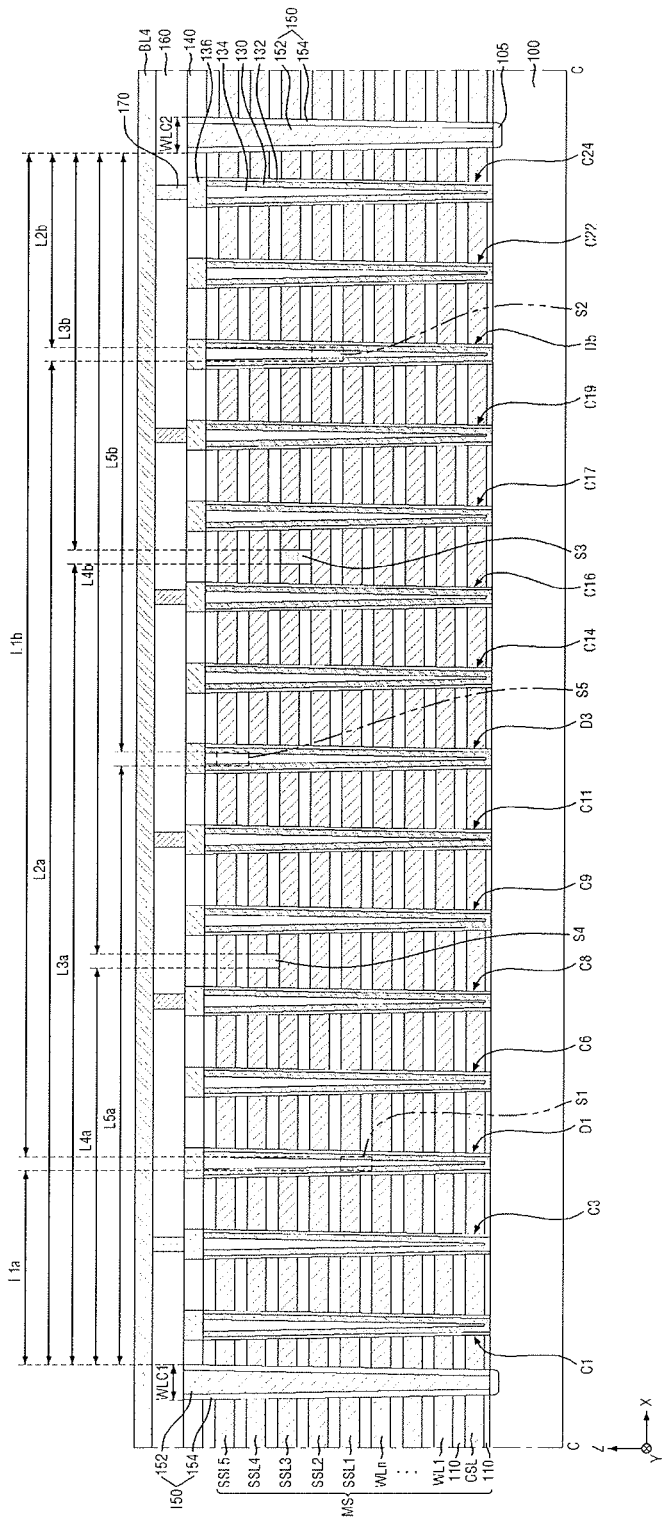

FIG. 15 is a layout diagram of a nonvolatile memory device according to some embodiments. FIGS. 16 and 17 are various cross-sectional views taken along a line D-D of FIG. 15. For convenience of explanation, repeated parts of contents described above using FIGS. 1 to 14 may be briefly described or omitted.

Referring to FIGS. 15 and 16, the nonvolatile memory device according to some embodiments may further include a fifth string selection line SSL5 and a fifth cutting line S5.

The fifth string selection line SSL5 may be on the fourth string selection line SSL4. In an implementation, the fifth string selection line SSL5 may be a gate electrode at the uppermost part among the plurality of gate electrodes (GSL, WL1 to WLn, and SSL1 to SSL5).

The fifth cutting line S5 may extend, e.g., in the second direction Y to cut the fifth string selection line SSL5.

The fifth cutting line S5 may re-separate the fifth string selection line SSL5 separated by the first cutting region WLC1 and the second cutting region WLC2. The fifth cutting line S5 may be separated from the first cutting region WLC1 by a ninth distance L5a, and may be separated from the second cutting region WLC2 by a tenth distance L5b (e.g., in the first direction X).

In an implementation, a fifth difference between the ninth distance L5a and the tenth distance L5b may be smaller than the first difference between the first distance L1a and the second distance L1b, and smaller than the second difference between the third distance L2a and the fourth distance L2b. In an implementation, the fifth difference between the ninth distance L5a and the tenth distance L5b may be smaller than the third difference between the fifth distance L3a and the sixth distance L3b, and smaller than the fourth difference between the seventh distance L4a and the eighth distance L4b.

In an implementation, the ninth distance L5a and the tenth distance L5b may be the same. In an implementation, the fifth difference between the ninth distance L5a and the tenth distance L5b may be zero.

Referring to FIGS. 15 and 17, in the nonvolatile memory device according to some embodiments, the sixth distance L3b may be smaller than the fifth distance L3a, and the eighth distance L4b may be greater than the seventh distance L4a.

In an implementation, from a planar viewpoint, the positions of the third cutting line S3 and the fourth cutting line S4 of FIG. 17 may be in the form in which the positions of the third cutting line S3 and the fourth cutting line S4 of FIG. 16 are changed from each other.

In an implementation, the fifth difference between the ninth distance L5a and the tenth distance L5b may be smaller than the third difference between the fifth distance L3a and the sixth distance L3b, and smaller than the fourth difference between the seventh distance L4a and the eighth distance L4b.

Hereinafter, a method for fabricating a nonvolatile memory device according to some embodiments will be described with reference to FIGS. 2, 3, and 18 to 26.

FIGS. 18 to 26 are sectional view of stages in a method for fabricating the nonvolatile memory device according to some embodiments. For convenience of explanation, repeated parts of contents described above using FIGS. 1 to 17 may be briefly described or omitted. For reference, FIGS. 18 to 26 are cross-sectional views taken along a line A-A of FIG. 2.

Figure 18:
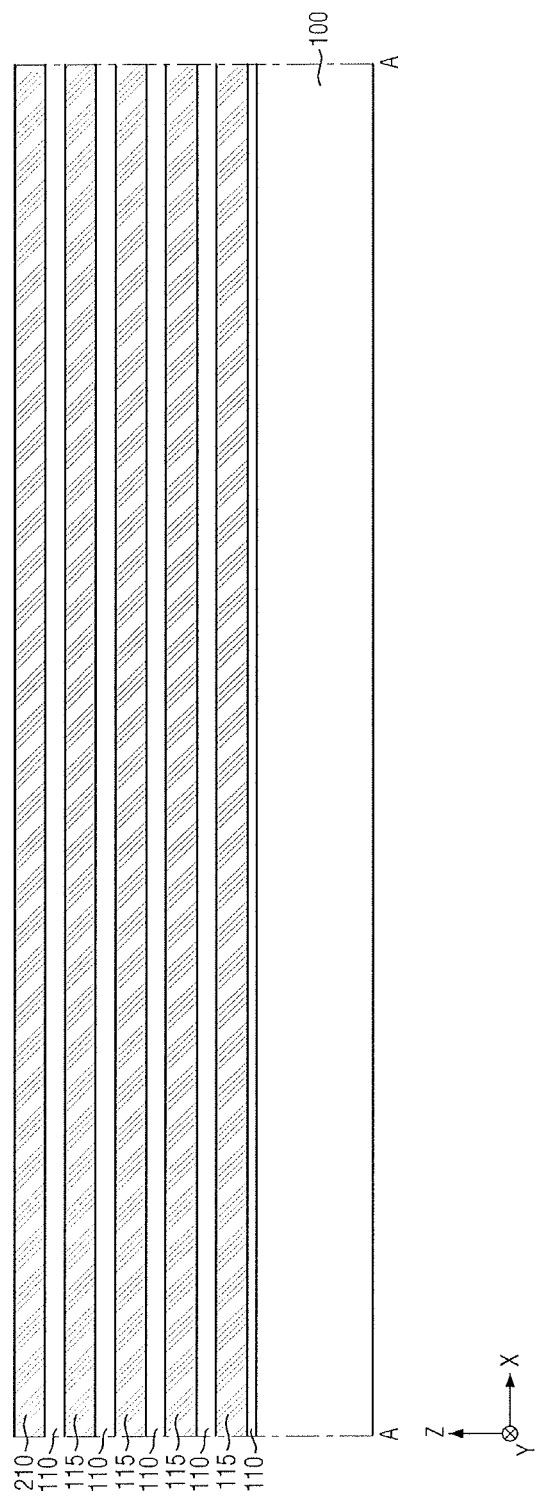
FIGS. 18 to 26 illustrate stages in a method for fabricating the nonvolatile memory device according to some embodiments.

Referring to FIG. 18, a plurality of first sacrificial patterns 115, a plurality of insulating patterns 110, and a second sacrificial pattern 210 may be formed on the substrate 100.

Each first sacrificial pattern 115 may be alternately stacked with each insulating pattern 110.

The second sacrificial pattern 210 may be stacked on the plurality of first sacrificial patterns 115 and the plurality of insulating patterns 110. In an implementation, the second sacrificial pattern 210 may be formed on the uppermost first sacrificial pattern 115. In an implementation, the second sacrificial pattern 210 may be spaced apart from the uppermost first sacrificial pattern 115 by the insulating pattern 110.

Figure 19:
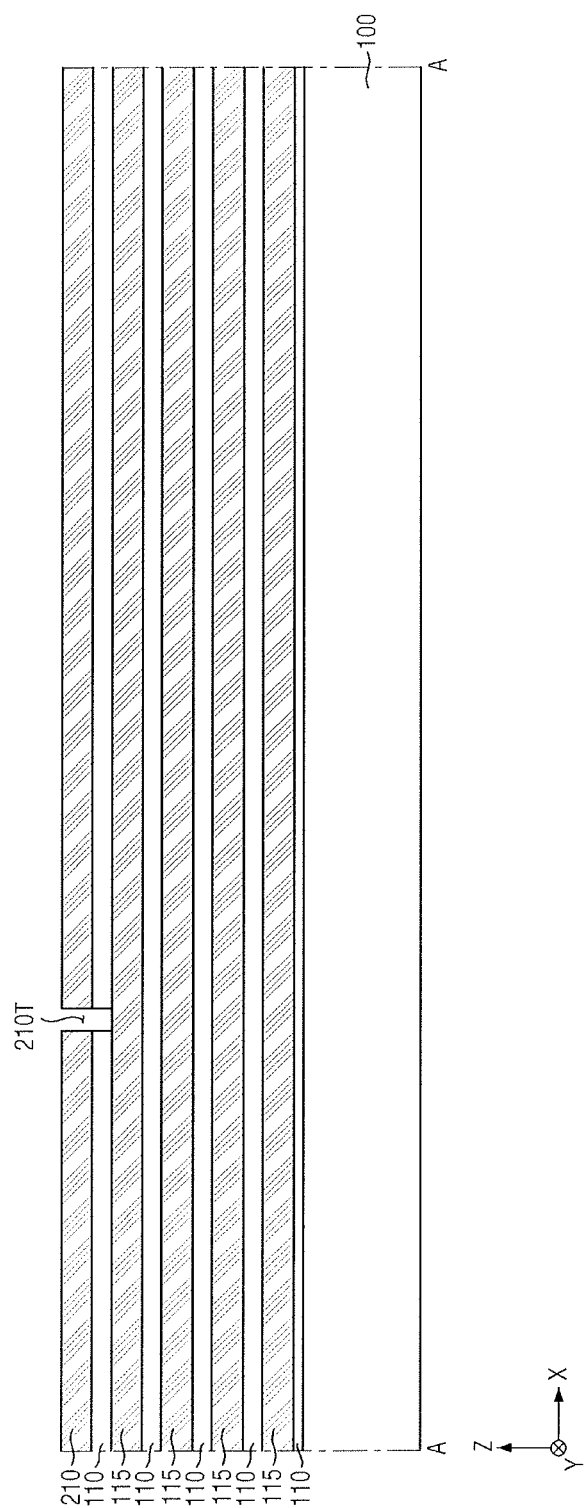

Referring to FIG. 19, the second sacrificial pattern 210 may be cut.

In an implementation, a trench 210T for cutting the second sacrificial pattern 210 may be formed in the second sacrificial pattern 210. The trench 210T may be formed, e.g., by etching a part of the second sacrificial pattern 210.

In an implementation, the trench 210T may extend in the second direction Y. In an implementation, the bottom surface of the trench 210T may be lower (e.g., closer to the substrate 100 in the third direction Z) than the bottom surface of the second sacrificial pattern 210. In an implementation, the trench 210T may penetrate the insulating pattern 110 below the second sacrificial pattern 210 and expose the upper surface of the first sacrificial pattern 115.

Figure 20:
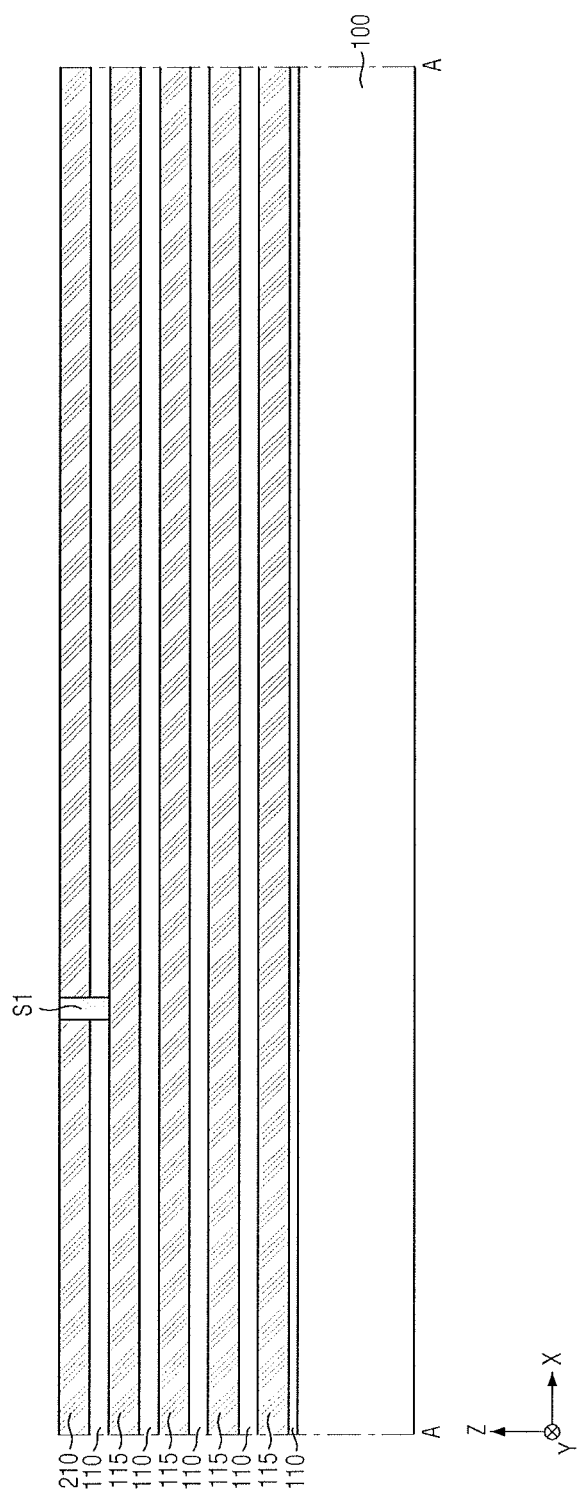

Referring to FIG. 20, a first cutting line S1 (for cutting the second sacrificial pattern 210) may be formed.

In an implementation, an insulating material for filling the trench 210T may be formed on the second sacrificial pattern 210, and then, a planarization process may be performed. Therefore, a first cutting line S1 filling the trench 210T may be formed. The insulating material may include, e.g., silicon oxide, silicon nitride, or silicon oxynitride.

Figure 21:
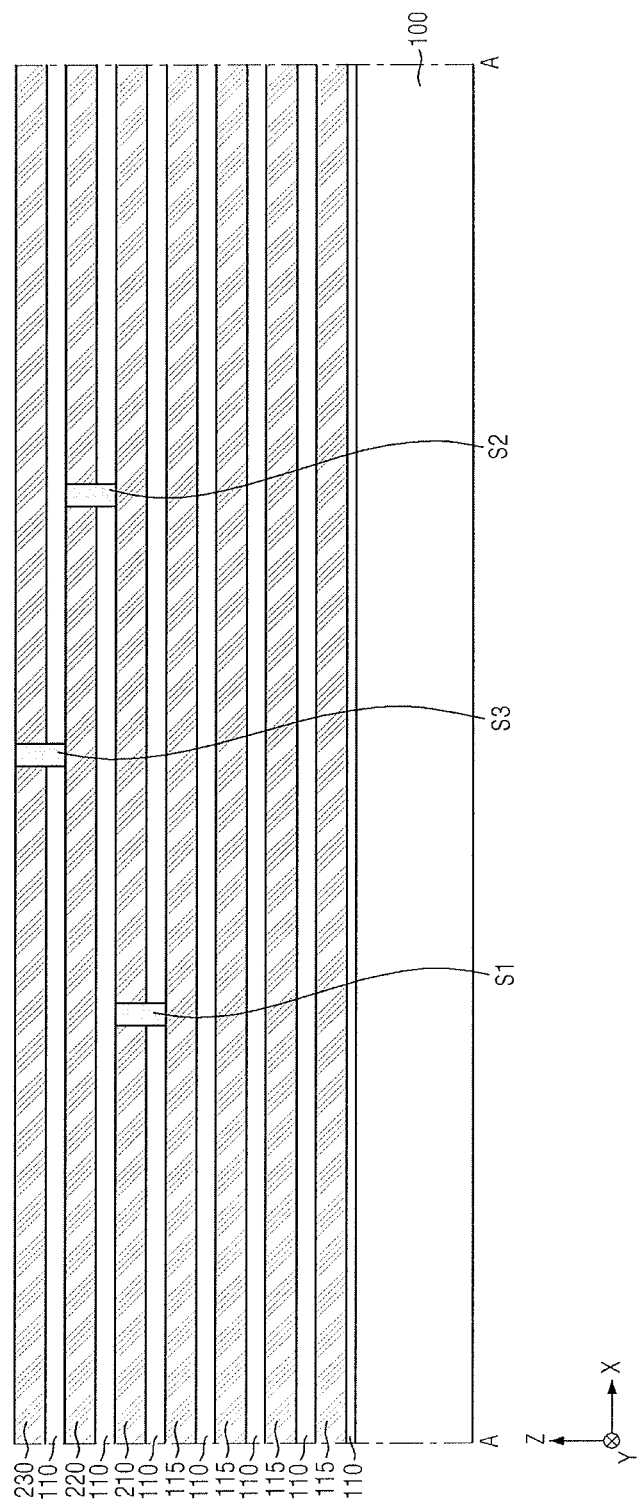

Referring to FIG. 21, a third sacrificial pattern 220, a second cutting line S2, a fourth sacrificial pattern 230 and the third cutting line S3 may be formed on the second sacrificial pattern 210 and the first cutting line S1.

Formation of the third sacrificial pattern 220, the second cutting line S2, the fourth sacrificial pattern 230, and the third cutting line S3 may be similar to the formation of the second sacrificial pattern 210 and the first cutting line S1, and a repeated detailed description thereof may be omitted.

Figure 22:
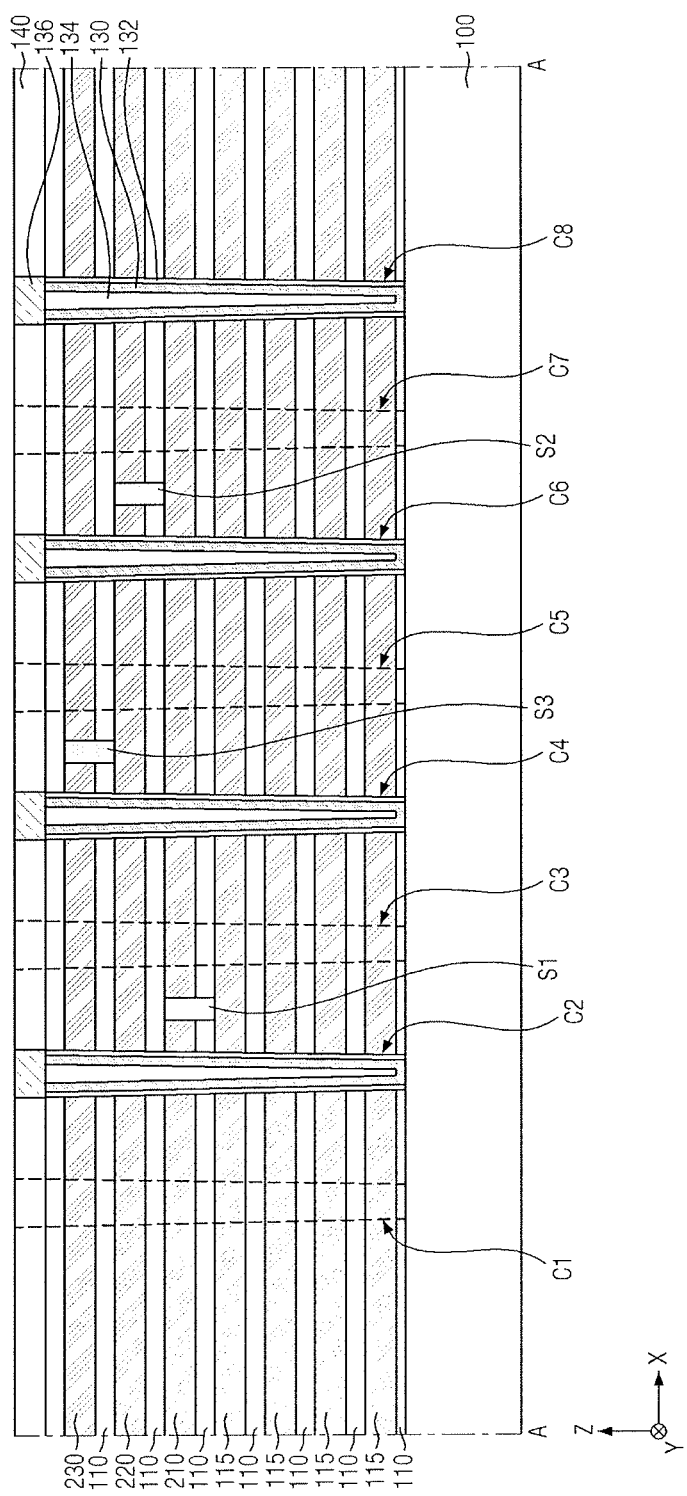

Referring to FIG. 22, a plurality of channel structures C1 to C8 that penetrates the first to fourth sacrificial patterns 115, 210, 220 and 230 and the plurality of insulating patterns 110 and connected to the substrate 100 may be formed.

In an implementation, a penetration hole that penetrates the first to fourth sacrificial patterns 115, 210, 220 and 230 and the plurality of insulating patterns 110 and that exposes the substrate 100 may be formed. Subsequently, an information storage film 132 and a semiconductor pattern 130 sequentially stacked in the penetration hole may be formed.

In an implementation, a filling insulating pattern 134 may be further formed on the semiconductor pattern 130. In an implementation, a channel pad 136 may be further formed on the semiconductor pattern 130.

Figure 23:
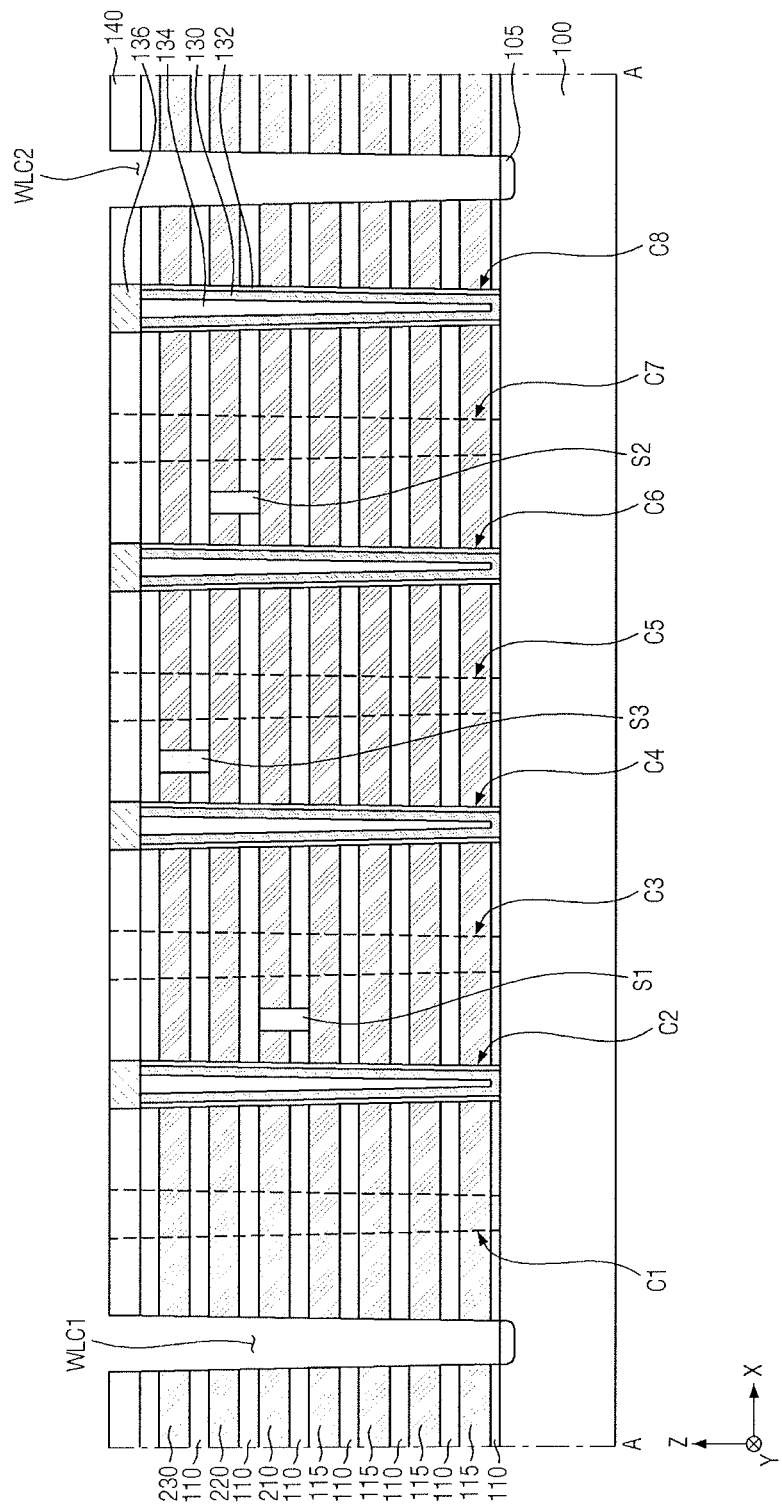

Referring to FIG. 23, a first cutting region WLC1 and a second cutting region WLC2 may be formed in the first to fourth sacrificial patterns 115, 210, 220 and 230 and the plurality of insulating patterns 110.

The first cutting region WLC1 and the second cutting region WLC2 may cut the first to fourth sacrificial patterns 115, 210, 220 and 230 and the plurality of insulating patterns 110.

In an implementation, each of the first cutting region WLC1 and the second cutting region WLC2 may be formed to extend side by side along the second direction Y.

In an implementation, an impurity region 105 may be formed in the substrate 100 exposed during forming of the first cutting region WLC1 and the second cutting region WLC2.

Figure 24:
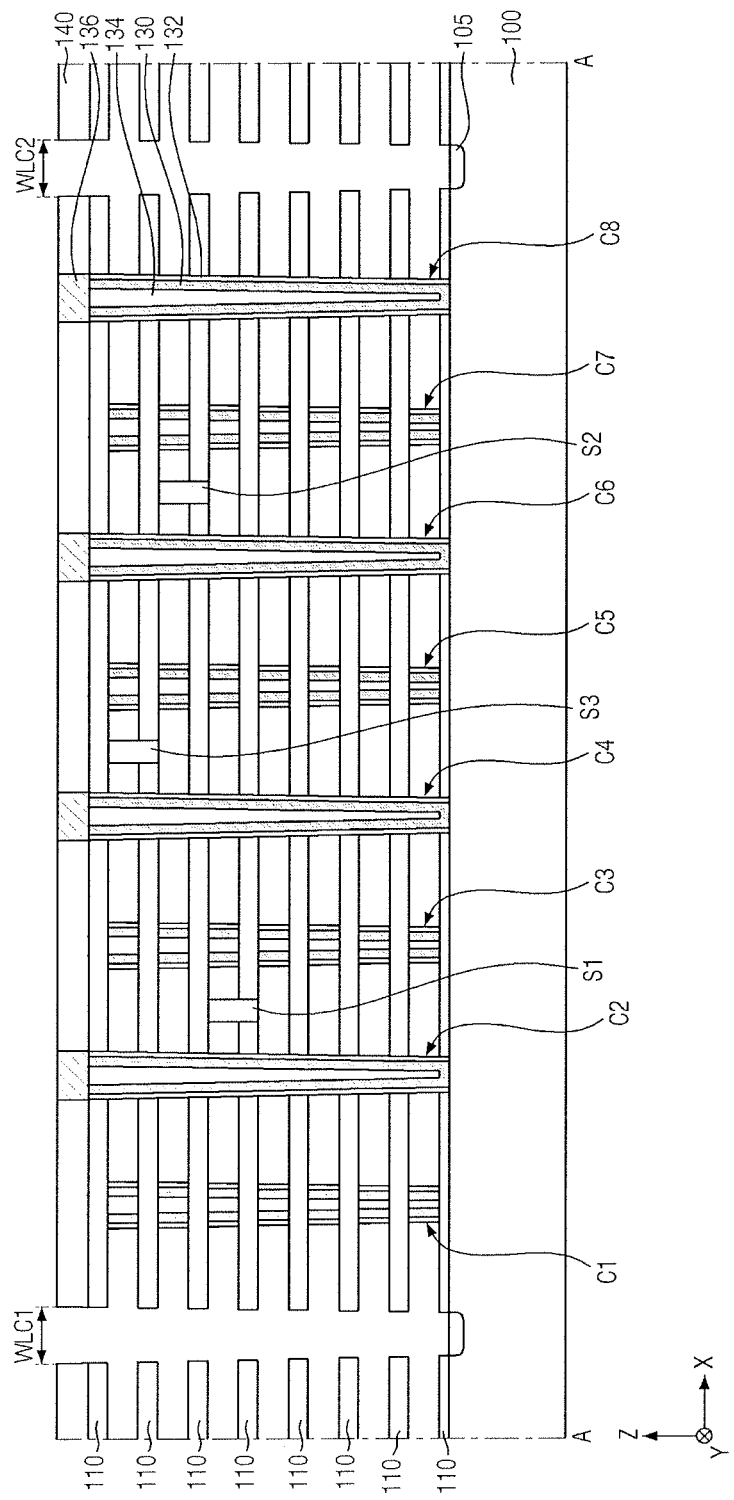

Referring to FIG. 24, the first to fourth sacrificial patterns 115, 210, 220 and 230 exposed by the first cutting region WLC1 and the second cutting region WLC2 may be removed.

The removal of the first to fourth sacrificial patterns 115, 210, 220 and 230 may be performed by, e.g., an anisotropic etching process.

Figure 25:
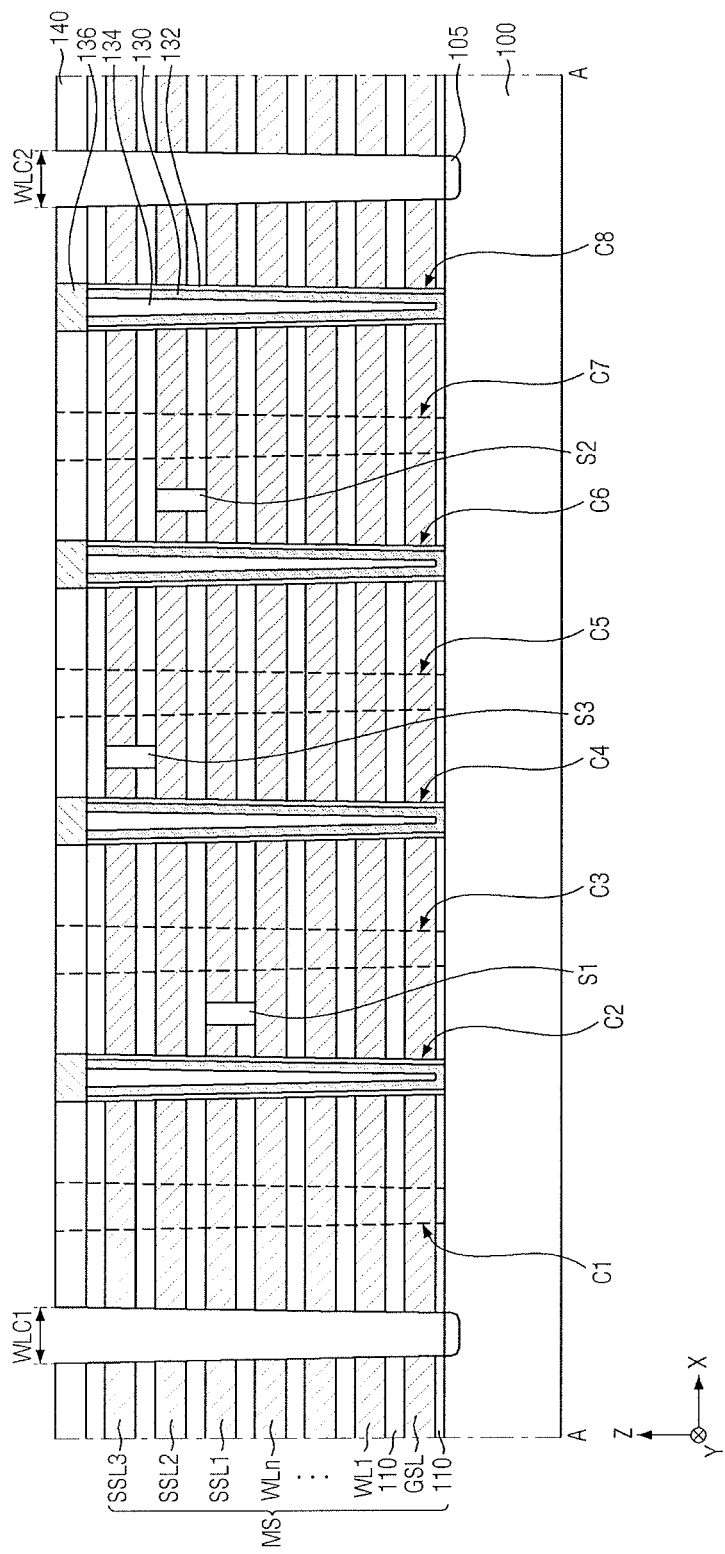

Referring to FIG. 25, a plurality of gate electrodes (GSL, WL1 to WLn, and SSL1 to SSL3) may be formed on the substrate 100.

The plurality of gate electrodes (GSL, WL1 to WLn, and SSL1 to SSL3) may be formed in a region in which the first to fourth sacrificial patterns 115, 210, 220 and 230 have been removed. In an implementation, the first to fourth sacrificial patterns 115, 210, 220 and 230 may be replaced with a plurality of gate electrodes (GSL, WL1 to WLn, and SSL1 to SSL3).

The first cutting line S1 may cut the first string selection line SSL1, the second cutting line S2 may cut the second string selection line SSL2, and the third cutting line S3 may cut the third string selection line SSL3.

Figure 26:
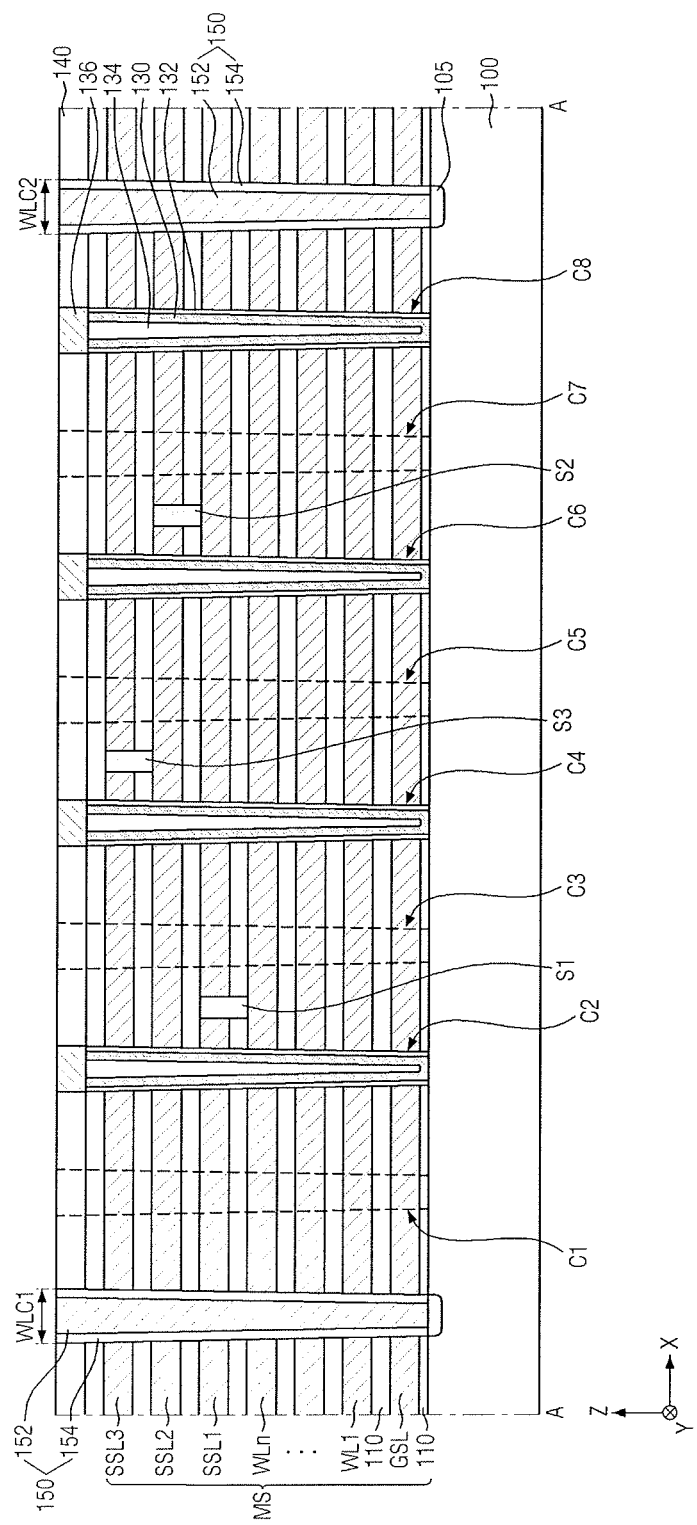

Referring to FIG. 26, the cutting structure 150 may be formed in the first cutting region WLC1 and the second cutting region WLC2.

In an implementation, the cutting structure 150 may include a plug pattern 152 and a spacer 154.

Subsequently, referring to FIG. 3, a plurality of bit lines BL1 and BL2 may be formed on the mold structure MS.

The plurality of bit lines BL1 and BL2 may be formed to be connected to the plurality of channel structures C1 to C8. In an implementation, the second interlayer insulating film 160 may be formed on the mold structure MS. Subsequently, a bit line contact 170 that penetrates the second interlayer insulating film 160 to electrically connect the respective channel structures CS1 to CS6 and the respective bit lines BL1 and BL2 may be formed.

One or more embodiments may provide a nonvolatile memory device including a plurality of string selection lines.

One or more embodiments may provide a nonvolatile memory device with improved operating performance and reliability.

One or more embodiments may provide a method for fabricating a nonvolatile memory device with improved operating performance and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device, comprising:
a mold structure that includes a plurality of word lines stacked on a substrate and first, second, and third string selection lines sequentially stacked on the plurality of word lines;
a plurality of channel structures that penetrates the mold structure and is connected to the substrate;
a first cutting region that cuts the mold structure;
a second cutting region that is spaced apart from the first cutting region in a first direction parallel to an upper surface of the substrate and that cuts the mold structure, the first and second cutting regions extending in a second direction intersecting the first direction, the first and second cutting regions being immediately adjacent to each other;
first, second and third cutting lines that extend in the second direction and cut at least one of the first, second and third string selection lines between the first cutting region and the second cutting region; and
a bit line on the mold structure extending in the first direction,
wherein the channel structures include first to fourth channel structures sequentially arranged in the first direction between the first cutting region and the second cutting region and electrically connected to the bit line.

2. The nonvolatile memory device as claimed in claim 1, wherein:
the first channel structure is between the first cutting region and the first cutting line in the first direction,
the second channel structure is between the first cutting line and the third cutting line in the first direction,
the third channel structure is between the third cutting line and the second cutting line in the first direction, and
the fourth channel structure is between the second cutting line and the second cutting region in the first direction.

3. The nonvolatile memory device as claimed in claim 1, further comprising a plurality of dummy channel structures that is spaced apart from the channel structures, penetrates the mold structure, and intersects each word line of the plurality of word lines.

4. The nonvolatile memory device as claimed in claim 3, wherein the plurality of dummy channel structures includes:
a first dummy channel structure that crosses the first cutting line,
a second dummy channel structure that crosses the third cutting line, and
a third dummy channel structure that crosses the second cutting line.

5. The nonvolatile memory device as claimed in claim 3, wherein the channel structures are arranged along the first direction in a zigzag shape and the dummy channel structures are arranged along the first direction in a zigzag shape.

6. The nonvolatile memory device as claimed in claim 3, wherein the dummy channel structures are not connected to the bit line.

7. The nonvolatile memory device as claimed in claim 3, wherein:
the dummy channel structures has a pillar shape extending in a third direction intersecting the first direction and the second direction, and
each of the dummy channel structures includes:
a semiconductor pattern that penetrates the mold structure and is connected to the substrate, and
an information storage film between the semiconductor pattern and each word line of the plurality of word lines.

8. The nonvolatile memory device as claimed in claim 1, wherein the third cutting line is between the first cutting line and the second cutting line with respect to a plan view.

9. The nonvolatile memory device as claimed in claim 1, wherein:
the first cutting line cuts the first string selection line,
the second cutting line cuts the second string selection line, and
the third cutting line cuts the third string selection line.

10. The nonvolatile memory device as claimed in claim 1, wherein a width of each of the first, second, and third cutting lines in the first direction increases in a third direction extending away from the substrate.

11. A nonvolatile memory device, comprising:
a mold structure including a plurality of gate electrodes on a substrate, the plurality of gate electrodes including first, second, and third string selection lines sequentially stacked on the substrate;
a plurality of channel structures that penetrates the mold structure and intersects the plurality of gate electrodes, wherein each gate electrode of the plurality of gate electrodes is intersected by at least one channel structure of the plurality of channel structures;
a first cutting region that cuts each gate electrode of the plurality of gate electrodes;
a second cutting region that is spaced apart from the first cutting region in a first direction and cuts each gate electrode of the plurality of gate electrodes;
a first cutting line that cuts the first string selection line between the first cutting region and the second cutting region;
a second cutting line that cuts the second string selection line between the first cutting region and the second cutting region;
a third cutting line that cuts the third string selection line between the first cutting region and the second cutting region; and
a plurality of bit lines connected to the plurality of channel structures and extending in the first direction,
wherein:
the first cutting line is spaced apart from the first cutting region by a first distance and is spaced apart from the second cutting region by a second distance,
the second cutting line is spaced apart from the first cutting region by a third distance and is spaced apart from the second cutting region by a fourth distance,
the third cutting line is spaced apart from the first cutting region by a fifth distance and is spaced apart from the second cutting region by a sixth distance,
a first difference between the first distance and the second distance is greater than a third difference between the fifth distance and the sixth distance,
a second difference between the third distance and the fourth distance is greater than the third difference, and
the plurality of bit lines includes first to fourth bit lines each connected to four channel structures of the plurality of channel structures.

12. The nonvolatile memory device as claimed in claim 11, wherein:
the plurality of channel structures includes first to sixteenth channel structures,
the first bit line is connected to the first to fourth channel structures,
the second bit line is connected to the fifth to eighth channel structures and is spaced apart from the first bit line in a second direction,
the third bit line is connected to the ninth to twelfth channel structures and is spaced apart from the second bit line in the second direction, and
the fourth bit line is connected to the thirteenth to sixteenth channel structures and is spaced apart from the third bit line in the second direction.

13. The nonvolatile memory device as claimed in claim 11, wherein the channel structures include first to fourth channel structures sequentially arranged in the first direction between the first cutting region and the second cutting region, and wherein:
the first channel structure is between the first cutting region and the first cutting line in the first direction,
the second channel structure is between the first cutting line and the third cutting line in the first direction,
the third channel structure is between the third cutting line and the second cutting line in the first direction, and
the fourth channel structure is between the second cutting line and the second cutting region in the first direction.

14. The nonvolatile memory device as claimed in claim 11, further comprising a plurality of dummy channel structures, wherein each dummy channel structure of the plurality of dummy channel structures is spaced apart from the channel structures, penetrates the mold structure, and intersects at least one gate electrode of the plurality of gate electrodes, and wherein each gate electrode of the plurality of gate electrodes is intersected by at least one dummy channel structure of the plurality of dummy channel structures.

15. The nonvolatile memory device as claimed in claim 14, wherein a bit line contact is not formed on the plurality of dummy channel structures.

16. The nonvolatile memory device as claimed in claim 11, wherein the third string selection line is an uppermost gate electrode among the plurality of gate electrodes relative to the substrate.

17. A nonvolatile memory device, comprising:
a mold structure including a plurality of gate electrodes on a substrate, the plurality of gate electrodes including first, second, and third string selection lines sequentially stacked on the substrate;
channel structures that penetrate the mold structure and intersect each gate electrode of the plurality of gate electrodes;
a first cutting region that cuts each gate electrode of the plurality of gate electrodes;
a second cutting region that is spaced apart from the first cutting region in a first direction and cuts each gate electrode is of the plurality of gate electrodes;
a first cutting line that cuts the first string selection line between the first cutting region and the second cutting region;
a second cutting line that cuts the second string selection line between the first cutting region and the second cutting region; and
a third cutting line that cuts a third string selection line between the first cutting region and the second cutting region,
wherein:
the first cutting line is spaced apart from the first cutting region by a first distance and is spaced apart from the second cutting region by a second distance greater than the first distance,
the second cutting line is spaced apart from the first cutting region by a third distance and is spaced apart from the second cutting region by a fourth distance smaller than the third distance,
the third cutting line is spaced apart from the first cutting region by a fifth distance greater than the first distance and greater than the fourth distance,
the third cutting line is spaced apart from the second cutting region by a sixth distance greater than the first distance and greater than the fourth distance,
the channel structures include first to fourth channel structures sequentially arranged in the first direction between the first cutting region and the second cutting region and electrically connected to each other.

18. The nonvolatile memory device as claimed in claim 17, wherein:
the first channel structure is between the first cutting region and the first cutting line in the first direction,
the second channel structure is between the first cutting line and the third cutting line in the first direction,
the third channel structure is between the third cutting line and the second cutting line in the first direction, and
the fourth channel structure is between the second cutting line and the second cutting region in the first direction.

19. The nonvolatile memory device as claimed in claim 17, further comprising a bit line on the mold structure and electrically connected to the channel structures,
wherein the bit line extends in the first direction.

20. The nonvolatile memory device as claimed in claim 17, wherein the first, second, and third cutting lines do not overlap each other with respect to a plan view.

* * * * *